United States Patent [19]
Satoh

[11] Patent Number: 5,740,097
[45] Date of Patent: Apr. 14, 1998

[54] CONTENT-ADDRESSABLE-MEMORY CONTROL CIRCUIT

[75] Inventor: Akashi Satoh, Yamato, Japan

[73] Assignee: International Business Machines Corporation, Armonk, N.Y.

[21] Appl. No.: 563,830

[22] Filed: Nov. 28, 1995

[30] Foreign Application Priority Data

Nov. 28, 1994 [JP] Japan .................... 6-292556

[51] Int. Cl.$^6$ .................................. G11C 15/00
[52] U.S. Cl. ............................ 365/49; 365/189.07
[58] Field of Search .................... 365/49, 189.07

[56] References Cited

U.S. PATENT DOCUMENTS 5,396,449 3/1995 Atallah et al. .................... 365/49
5,483,480 1/1996 Yoneda ............................ 365/49

Primary Examiner—David C. Nelms
Assistant Examiner—Hoal V. Ho
Attorney, Agent, or Firm—James M. Leas

[57] ABSTRACT

A timing control signal SR is made low to switch on a P-MOSFET and switch off an N-MOSFET, and with an N-MOSFET as a boundary, a voltage $V_{MATCHI}$ on the side of a NOT circuit of a match-line is pulled up to a power supply voltage $V_{DD}$. During this, a comparison operation is done in a content addressable memory cell, and an N-MOSFET is switched on or off according to the result of comparison. Next, the control signal SR goes to a logic high level, so the P-MOSFET is switched off and the N-MOSFET is switched on. As a result, if the N-MOSFET is on, the voltages $V_{MATCHI}$ and $V_{MATCH}$ will be reduced to a ground level, but the through current is prevented because the P-MOSFET is off. If the N-MOSFET is off, the $V_{MATCH}$ will be pulled up to $V_{DD}-V_m$ ($V_m$ is the threshold voltage of the N-MOSFET), the $V_{MATCHI}$ will be held to $V_{DD}$ by the NOT circuit and the P-MOSFET, and a signal representative of a result of comparison will be output from the NOT circuit. Also, by the interval of the N-MOSFET, the parasitic capacitance of the portion on the side of the content addressable memory cell of the match-line with the MOSFET as a boundary disappears from the portion on the side of the pull-up means from the portion on the side of the NOT circuit with the voltage drop element as a boundary, so the pull-up of the portion on the side of the NOT circuit with the MOSFET as a boundary becomes fast.

14 Claims, 24 Drawing Sheets

28 Content addressable memory cell
42 N-MOSFET
58 Match-line controller
60 N-MOSFET
62 P-MOSFET

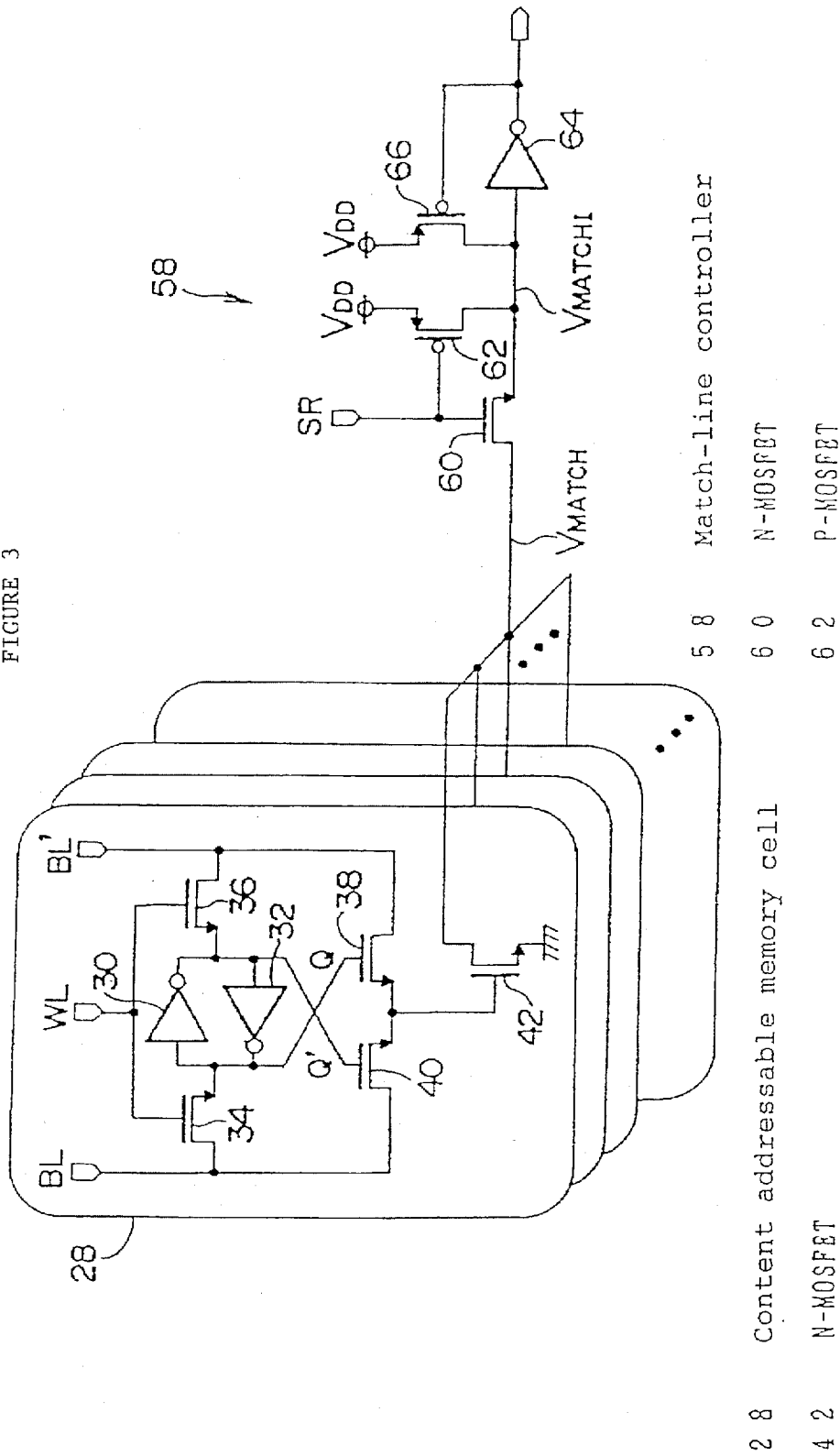

50A Signal generation circuit (Power supply voltage: 3.6 V, Surrounding temp.: 0°C, Process parameter: Optimum)

(Power supply voltage: 3.0 V, Surrounding temp.: 100°C, Process parameter: Worst)

Power supply voltage: 3.6 V, Surrounding temp.: 0°C,
Process parameter: Optimum case Power supply voltage: 3.0 V, Surrounding temp.: 100°C,
Process parameter: Worst case

CONTENT-ADDRESSABLE-MEMORY CONTROL CIRCUIT

FIELD OF THE INVENTION

The present invention relates to a content-addressable-memory control circuit and a content addressable memory device, and more particularly to a content-addressable-memory control circuit that is connected to a content addressable memory which, if comparison data is input, will switch on or off a switching element connected to a match-line according to a result of comparison between the comparison data and data stored in a memory element, and a content addressable memory device including the content-addressable-memory control circuit and the content addressable memory.

BACKGROUND OF THE INVENTION

As an example of hardware utilized in searching, there is known a CAM (content addressable memory). In a general memory, if an address of a memory location is specified, the general memory will output data stored in a memory area corresponding to that address. By contrast, in a content addressable memory, if data is specified, the cam will output an address of a memory area in which that data is stored. The cell of the content addressable memory and a match-line controller for driving this cell are constituted as shown in FIG. 24 by way of example.

Content addressable memory cell 28 is provided with two NOT circuits 30 and 32 in which each input terminal and each output terminal are connected with each other, and a loop of these NOT circuits 30 and 32 constitutes a storage circuit for storing one-bit data. The output terminal of NOT circuit 30 is connected to the source of N-channel MOSFET (hereinafter referred to as an N-MOSFET) 34, and the output terminal of NOT circuit 32 is connected to source of N-MOSFET 36. The gates of N-MOSFETs 34 and 36 are connected to word line WL, and the drains are connected to bit lines BL and BL', respectively.

The output terminal of NOT circuit 30 is also connected to the gate of N-MOSFET 38, and the output terminal of NOT circuit 32 is also connected to the gate of N-MOSFET 40. Note that from NOT circuit 32 the inverted data (Q') of data D supplied through bitline BL in data storing period is output, and from NOT circuit 30 the inverted data Q (=D) of data Q' is output. The drains of N-MOSFETs 38 and 40 are connected to the bit lines BL' and BL, respectively, and the sources are connected to the gate of N-MOSFET 42. The drain of N-MOSFET 42 is connected to a match-line MATCH, and the source is connected to ground. To the content addressable memory cell 28, comparison data are supplied in sequence through the bit lines BL and BL' at a predetermined cycle.

On the other hand, match-line controller 200 comprises a NOT circuit 202 disposed on the match-line so that its input terminal becomes the side of the content addressable memory cell 28, and a P-channel MOSFET (hereinafter referred to as P-MOSFET) 204 whose drain is connected to the input terminal of NOT circuit 202 of the match-line. The source of P-MOSFET 204 is connected to a power supply, and the gate is connected to ground. Note that a plurality of content addressable memory cells 28 (e.g., 8 or 16 memories) of the same constitution are connected to the match-line.

In the above-described constitution P-MOSFET 204 is normally on. Each content addressable memory cell 28 compares the data stored therein with the data supplied. N-MOSFET 42 is switched off when the result of comparison is "match" and on when the result of comparison is "mismatch." If N-MOSFET 42 is switched on with any of content addressable memory cells 28, the match-line will go to a logic low level. Also, when the results of comparison of all content addressable memory cells 28 connected to the same match-line are "match," the match-line is held in the state that it has been pulled up to a logic high level through P-MOSFET 204. Therefore, it can be detected if the comparison data has been found based on the level of the output signal that was level-corrected (the change in the voltage level of the output signal becomes sharp with respect to the voltage level of the match-line that gradually reduces when the result of comparison is "mismatch," and the level also goes to supply voltage level $V_{DD}$, or ground, level) and inverted through NOT circuit 202.

When in the above the result of comparison is "mismatch" N-MOSFET 42 is on, however, there was the problem that the through current which passes through P-MOSFET 204, the match-line, and N-MOSFET 42 flows constantly, so power is wastefully dissipated. If the internal resistance of P-MOSFET 204 is increased to reduce power to be wastefully dissipated by this through current, the speed at which the match-line in the logic low level is pulled up to a logic high level through P-MOSFET 204 (in a case where the result of comparison turns from "mismatch" to "match") will be reduced, so that the searching speed by the content addressable memory will be reduced. Also, since the P-MOSFET whose electric resistance value is high occupies a large area on the chip, the degree of integration of an integrated circuit will be reduced.

Also, if in the circuit shown in FIG. 24 the power supply voltage is made $V_{DD}$, the voltage of the match-line will change between 0 and $V_{DD}$. Since the power dissipation of N-MOSFET 42 becomes larger as the amplitude of the change in the voltage of this match-line becomes larger, it is effective to make smaller the amplitude of the change in the voltage of the match-line to reduce the power dissipation. To detect the result of comparison with the change of the voltage of the match-line, however, it is necessary to change the voltage level of a signal that is inverted and output through the NOT circuit 202, with an amplitude more than a predetermined value. It was therefore difficult to make smaller the amplitude of the change of the voltage of the match-line to reduce power dissipation.

SUMMARY OF THE INVENTION

An object of the invention is to provide a content-addressable-memory control circuit which is capable of reducing power dissipated by the through current passing through a match-line.

It is another object of the present invention to provide a content-addressable-memory control circuit which is capable of reducing power dissipation by making the amplitude of a change in the voltage of the match-line smaller.

It is another object of the invention to provide a content addressable memory device which is capable of reducing power that is dissipated by the through current passing through the match-line.

A content-addressable-memory control circuit according to the present invention is a content-addressable-memory control circuit to be connected to a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element. The content-addressable-memory control circuit of the present invention includes pull-up means which comprises:

first switching means provided on said match-line between the opposite side of said switching element to said ground terminal and a power supply; and first control means for switching on said first switching means during the period that said content addressable memory is switching on or off said switching element according to said result of comparison, or during a partial period within a preparatory period before the comparison.

Also, a content-addressable-memory control circuit according to the present invention is a content-addressable-memory control circuit to be connected to a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element. The content-addressable-memory control circuit of the present invention comprises:

pull-up means provided on the opposite side of said switching element to said ground terminal for pulling up said match-line;

second switching means provided on said match-line between said pull-up means and said ground terminal; and second control means for switching on said second switching means during a partial period within the period that said content addressable memory is switching on or off said switching element according to said result of comparison.

Also, as one form of the present invention, it is preferable that the pull-up means comprise first switching means provided on said match-line between the opposite side of said switching element to said ground terminal and a power supply, and first control means for switching on said first switching means during a predetermined period before said second switching means is switched on.

Also, as one form of the present invention, it is preferable that a resistance element be further provided on said match-line between said pull-up means and said switching element of said content addressable memory.

Also, as one form of the present invention, it is preferable that the second switching means comprise a MOSFET and be provided on the match-line between the pull-up means and the switching element.

Also, a content-addressable-memory control circuit according to the present invention is a content-addressable-memory control circuit to be connected to a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element. The content-addressable-memory control circuit of the present invention comprises:

pull-up means provided with first switching means provided on said match-line between the opposite side of said switching element to said ground terminal and a power supply;

second switching means provided between said pull-up means and said switching element;

third control means for switching on said first switching means and for switching said first switching means off and said second switching means on within the period that said content addressable memory is switching on or off said switching element according to said result of comparison, after said second switching means has been switched off; and level correction means for correcting a reduction in an voltage of said match-line as said second switching means is switched on with said switching element switched off.

Also, as one form of the present invention, it is preferable that the second switching means comprise a MOSFET.

Also, a content-addressable-memory control circuit according to the present invention is a content-addressable-memory control circuit to be connected to a content addressable memory which comprises a memory element, a data input terminal, and a switching element provided between a match-line and a power supply and which, if comparison data is input through said data input terminal, will switch on or off said switching element according to a result of comparison between said comparison data and data stored in said memory element. The content-addressable-memory control circuit of the present invention includes pull-down means which comprises:

first switching means provided on said match-line between the opposite side of said switching element to said power supply and a ground terminal; and first control means for switching on said first switching means during the period that said content addressable memory is switching on or off said switching element according to said result of comparison, or during a partial period within a preparatory period before the comparison.

Also, a content-addressable-memory control circuit according to the present invention is a content-addressable-memory control circuit to be connected to a content addressable memory which comprises a memory element, a data input terminal, and a switching element provided between a match-line and a power supply and which, if comparison data is input through said data input terminal, will switch on or off said switching element according to a result of comparison between said comparison data and data stored in said memory element. The content-addressable-memory control circuit of the present invention comprises:

pull-down means provided on the opposite side of said switching element to said power supply for pulling down said match-line;

second switching means provided on said match-line between said pull-down means and said power supply; and second control means for switching on said second switching means during a partial period within the period that said content addressable memory is switching on or off said switching element according to said result of comparison.

Also, a content-addressable-memory control circuit according to the present invention is a content-addressable-memory control circuit to be connected to a content addressable memory which comprises a memory element, a data input terminal, and a switching element provided between a match-line and a power supply and which, if comparison data is input through said data input terminal, will switch on or off said switching element according to a result of comparison between said comparison data and data stored in said memory element. The content-addressable-memory control circuit of the present invention comprises:

pull-down means provided with first switching means provided on said match-line between the opposite side of said switching element to said power supply and a ground terminal;

second switching means provided between said pull-down means and said switching element;

third control means for switching on said first switching means and for switching said first switching means off and said second switching means on within the period that said content addressable memory is switching on or off said switching element according to said result of comparison, after said second switching means has been switched off; and level correction means for correcting a rise in an voltage of said match-line as said second switching means switched on with said switching element switched off.

Also, a content addressable memory device according to the present invention includes:

a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element; and pull-up means comprising first switching means provided on said match-line between the opposite side of said switching element to said ground terminal and a power supply, and first control means for switching on said first switching means during the period that said content addressable memory is switching on or off said switching element according to said result of comparison, or during a partial period within a preparatory period before the comparison.

Also, a content addressable memory device according to the present invention includes:

a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element;

pull-up means provided on the opposite side of said switching element to said ground terminal for pulling up said match-line;

second switching means provided on said match-line between said pull-up means and said ground terminal; and second control means for switching on said second switching means during a partial period within the period that said content addressable memory is switching on or off said switching element according to said result of comparison.

BRIEF DESCRIPTION OF THE DRAWINGS

FIG. 3 is a circuit diagram showing a content addressable memory cell and a match-line controller according to a first embodiment;

DETAILED DESCRIPTION OF THE INVENTION

Figure 1:
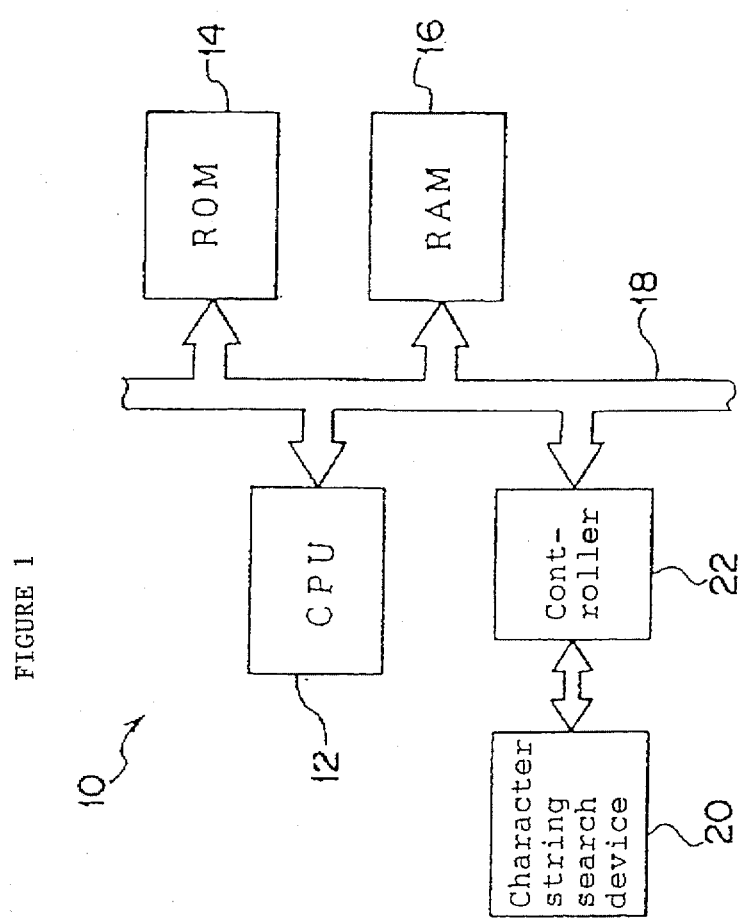
FIG. 1 is a block diagram showing the constitution of a microcomputer.

In the content-addressable-memory control circuit according to the present invention, the switching element of the content addressable memory is provided between a match-line and a ground terminal, the first switching means is provided on the match-line between the opposite side of the switching element of the content addressable memory to the ground terminal and a power supply, and the first switching means is switched on during the period that the content addressable memory is switching on or off the switching element according to the result of comparison, or during a partial period within a preparatory period before the comparison.

In the content addressable memory, the switching element is switched on or off according to the result of comparison between the data stored in the memory means and the comparison data input through the data input terminal. Therefore, if the first switching means is switched on when the switching element is off, the match-line will be pulled up and held in a logic high level even after the first switching means is switched off. Note that in a case where a plurality of content addressable memories are connected to a single match-line, the match-line is pulled up when the switching element of each of the plurality of content addressable memories is off.

Also, when the switching element is on, the match-line would be held in a logic low level even if the first switching means is switched on, so the through current is to flow from the power supply to the ground terminal. However, since the period that the first switching means is on is a partial period within the period that the content addressable memory is switching on or off the switching element, the period that the through current is flowing can be made shorter. The present invention, therefore, can reduce the power that is dissipated by the through current, as compared with the prior art in which the through current flows at all times during the period that the switching element of the content addressable memory is on.

Note that the voltage level of the match-line as a result of comparison can be latched after the first switching means has been switched on. Also, in the content addressable memory in the normal state, comparison data is input in sequence and the switching element is switched on or off according to the result of comparison as to each comparison data input. In this case, the first control means may switch on the first switching means during a partial period within the period that the switching element is on or off according to the result of comparison as to each comparison data, but when the input of the comparison data to the content addressable memory is started, the first switching means may also be switched on during a period (preparatory period) before the input of the comparison data is started.

Also, in the content-addressable-memory control circuit according to the present invention, pull-up means is provided on the opposite side of the switching element of the content addressable memory to the ground terminal for pulling up the match-line, and second switching means is provided on the match-line between the pull-up means and the ground terminal. The second switching means may be switched on during a partial period within the period that the content addressable memory is switching on or off the switching element according to the result of comparison.

Even if the pull-up means were so constituted as to pull up the match-line at all times, by the above-described constitution, there would be no possibility that, even if switching element were on, the through current would flow during the period that the second switching means is off. During a predetermined period that the second switching means is on, the through current will flow from the power supply to the ground terminal through the match-line if the switching element of the content addressable memory is on, but since the period that the second switching means is on is a partial period within the period that the content addressable memory is switching on or off the switching element, as in the above case, the period that the through current is flowing becomes short and therefore power dissipation can be reduced. Note that the voltage level of the match-line as a result of comparison can be latched after the second switching means has been switched on.

Note that the pull-up means preferably includes first switching means provided on the match-line between the opposite side of the switching element to the ground terminal and a power supply, and first control means for switching on the first switching means during a predetermined period before the second switching means is switched on.

Therefore, the first switching means is first switched on with the second switching means switched off, so the pull-up means side of the match-line is pulled up (charged) with the second switching means as a boundary and then the second switching means is switched on. At this time, if the switching element is off, the entire match-line will go to a logic high level by the charged electric charge, and if the switching element is on, the entire match-line will go to a logic low level. Also, since the first switching means is off when the second switching means is switched on, no through current flows from the power supply to the ground terminal through the match-line. Thus, since both of the first and second switching means are not open at the same time, the through current can completely be prevented and further power dissipation can be reduced.

Also, it is preferable that a resistance element be provided on the match-line between the pull-up means and the switching element of the content addressable memory. This element may be any element, so long as it has electric resistance, and general electric resistance elements, or semiconductor elements such as MOSFETs, or bipolar transistors, having internal resistance can be applied. As a result, when the match-line is pulled up by the pull-up means with the switching element switched off, the parasitic capacitance of a portion (hereinafter referred to as a first portion) on the switching element side of the match-line with the above-described resistance element as a boundary disappears from a portion (hereinafter referred to as a second portion) on the pull-up means side of the match-line with the resistance element as a boundary, so the pulling of the second portion becomes fast.

Since the switching element of each of a plurality of content addressable memories (cells) is normally connected to the match-line, the parasitic capacitance and time constant of the above-described first portion is very large as compared with the above-described second portion. But, as described above, when the match-line is pulled up with each switching element switched off, the voltage level of the second portion changes sharply without being subjected to the influence of the parasitic capacitance of the first portion, so the result of comparison can be obtained in a short period of time if the voltage level of the second portion of the match-line is latched. As a result, the content addressable memory can be operated at high speeds.

Also, in the present invention, it is preferable that the second switching means comprise a MOSFET (metal-oxide-semiconductor field-effect transistor) and be provided on the match-line between the pull-up means and the switching element. When in this case the match-line is pulled up by the pull-up means with the switching element switched off, the voltage of the first portion becomes lower than that of the second portion by the threshold voltage of the MOSFET. Also, when the switching element is on, the voltages of the first and second portions are both reduced to the ground level.

Therefore, since only the amplitude of a change in the voltage of the first portion in which the switching element of the content addressable memory is located can be made smaller without making smaller the amplitude of a change in the voltage of the second portion, the power dissipation by the switching element of the content addressable memory can be reduced. Also, if an output terminal for outputting a voltage level of the match-line is provided in the second portion, a change in voltage for detecting a result of comparison can be made an amplitude of more than a predetermined value.

Also, in a content-addressable-memory control circuit according to the present invention, pull-up means is provided with first switching means provided on the match-line between the opposite side of the switching element of the content addressable memory to the ground terminal and a power supply, and second switching means is provided between the pull-up means and the switching element of the content addressable memory. Third control means switches on the first switching means, and switches the first switching means off and the second switching means on within the period that the content addressable memory is switching on or off the switching element according to the result of comparison, after the second switching means has been switched off.

Since from the above-described constitution both of the first and second switching means are not switched on at the same time, as in the above case, the through current can completely be suppressed and the power dissipation can be reduced. Also, if in the above-described constitution the second switching means is switched on and the voltage level of the first portion has been less than a predetermined value by a previous comparison operation when the switching element of the content addressable memory is off, electric charge will be distributed from the pull-up means side (second portion) to the switching element side (first portion), with the second switching means as a boundary. The first switching means is switched off whenever the second switching means is switched on, so the voltage of the second portion is to be reduced. Also, in addition to the above, there is the possibility that the voltage of the second portion is reduced by a leak current, etc.

For this reason, in the present invention there is provided level correction means for correcting a reduction in an voltage of the match-line as the second switching means is switched on with the switching element switched off. This level correction means can be constituted by a half latch, for example. As a result, the voltage of the match-line as the second switching means is switched on with the switching element of the content addressable memory switched off can be made constant.

Note that if the second switching means of the present invention is constituted by a MOSFET, the amplitude of the change in the voltage of the first portion of the match-line will become smaller, as in the above case, so the power dissipation by the switching element of the content addressable memory can be reduced, and also a change in an voltage for detecting a result of comparison can be made an amplitude of more than a predetermined value.

Also, in a content-addressable-memory control circuit according to the present invention, the switching element of the content addressable memory is provided between a match-line and a power supply, first switching means is provided on the match-line between the opposite side of the switching element to the power supply and a ground terminal, and the first switching means is switched on during the period that the content addressable memory is switching on or off the switching element according to the result of comparison, or during a partial period within a preparatory period before the comparison. Therefore, as in the above case, the period that the through current is flowing becomes shorter and power dissipation can be reduced.

Also, in a content-addressable-memory control circuit according to the present invention, pull-down means is provided on the opposite side of the switching element to the power supply for pulling up the match-line, second switching means is provided on the match-line between the pull-down means and the power supply, and the second switching means is switched on during a partial period within the period that the content addressable memory is switching on or off the switching element according to the result of comparison. Therefore, the period that the through current is flowing becomes shorter and power dissipation can be reduced.

Also, if the pull-means is constituted by first switching means provided on the match-line between the opposite side of the switching element to the power supply and a ground terminal, and first control means for switching on said first switching means during a predetermined period before said second switching means is switched on, the through current can completely be suppressed and further power dissipation can be reduced. In addition, if a resistance element is provided on the match-line between the pull-down means and the switching element of the content addressable memory, a result of comparison can be obtained in a short period of time without undergoing the influence of the parasitic capacitance of the first portion, so the content addressable memory can be operated at high speeds. Further, if the second switching means is constituted by a MOSFET and provided on the match-line between the pull-down means and the switching element, only the amplitude of a change in the voltage of the first portion can be made smaller without making smaller the amplitude of a change in a voltage as a result of search, so the power dissipation by the switching element can be reduced.

Also, in a content-addressable-memory control circuit according to the present invention, pull-down means comprises first switching means provided on the match-line between the opposite side of the switching element to the power supply and a ground terminal, and second switching means is provided between the pull-down means and the switching element. Third control means switches on the first switching means and also switches the first switching means off and the second switching means on within the period that the content addressable memory is switching on or off the switching element according to the result of comparison, after the second switching means has been switched off, and there is provided level correction means for correcting a rise in an voltage of the match-line as the second switching means is switched on with the switching element switched off. As a result, the through current can completely be suppressed, power dissipation can be reduced, and the voltage of the match-line as the second switching means is switched on with the switching element of the content addressable memory switched off can be made constant.

Also, if the second switching means comprises a MOSFET, only the amplitude of a change in the voltage of the first portion can be made smaller without making smaller the amplitude of a change in a voltage as a result of search, and the power dissipation by the switching element of the content addressable memory can be reduced.

Also, in a content addressable memory device according to the present invention, there is provided a content addressable memory which, if comparison data is input through a data input terminal, will switch on or off a switching element provided between a match-line and a ground terminal according to a result of comparison between the comparison data and data stored in a memory element. There is also provided pull-up means, which comprises first switching means provided on the match-line between the opposite side of the switching element to the ground terminal and a power supply, and first control means for switching on the first switching means during the period that the content addressable memory is switching on or off the switching element according to the result of comparison, or during a partial period within a preparatory period before the comparison. As a result, the power that is dissipated by the through current passing through the match-line can be reduced.

Also, in a content addressable memory device according to the present invention, there is provided a content addressable memory which, if comparison data is input through a data input terminal, will switch on or off a switching element provided between a match line and a ground terminal according to a result of comparison between the comparison data and data stored in a memory element. There are also provided pull-up means provided on the opposite side of the switching element to the ground terminal for pulling up the match-line, second switching means provided on the match-line between the pull-up means and the ground terminal, and second control means for switching on the second switching means during a partial period within the period that the content addressable memory is switching on or off the switching element according to the result of comparison. As a result, the power that is dissipated by the through current passing through the match-line can be reduced.

An embodiment of the present invention will hereinafter be described in detail with reference to the drawings.
First Embodiment FIG. 1 shows the constitution (part) of a microcomputer 10 of a first embodiment to which the present invention was applied. The microcomputer 10 is provided with a CPU 12, a ROM 14, and a RAM 16, which are interconnected through a bus 18 consisting of an address bus, a data bus, and a control bus. The microcomputer 10 is also provided with a search device 20 according to the present invention. This search device 20 is connected to the bus 18 through a controller 22 for controlling the search device 20.

Figure 2:
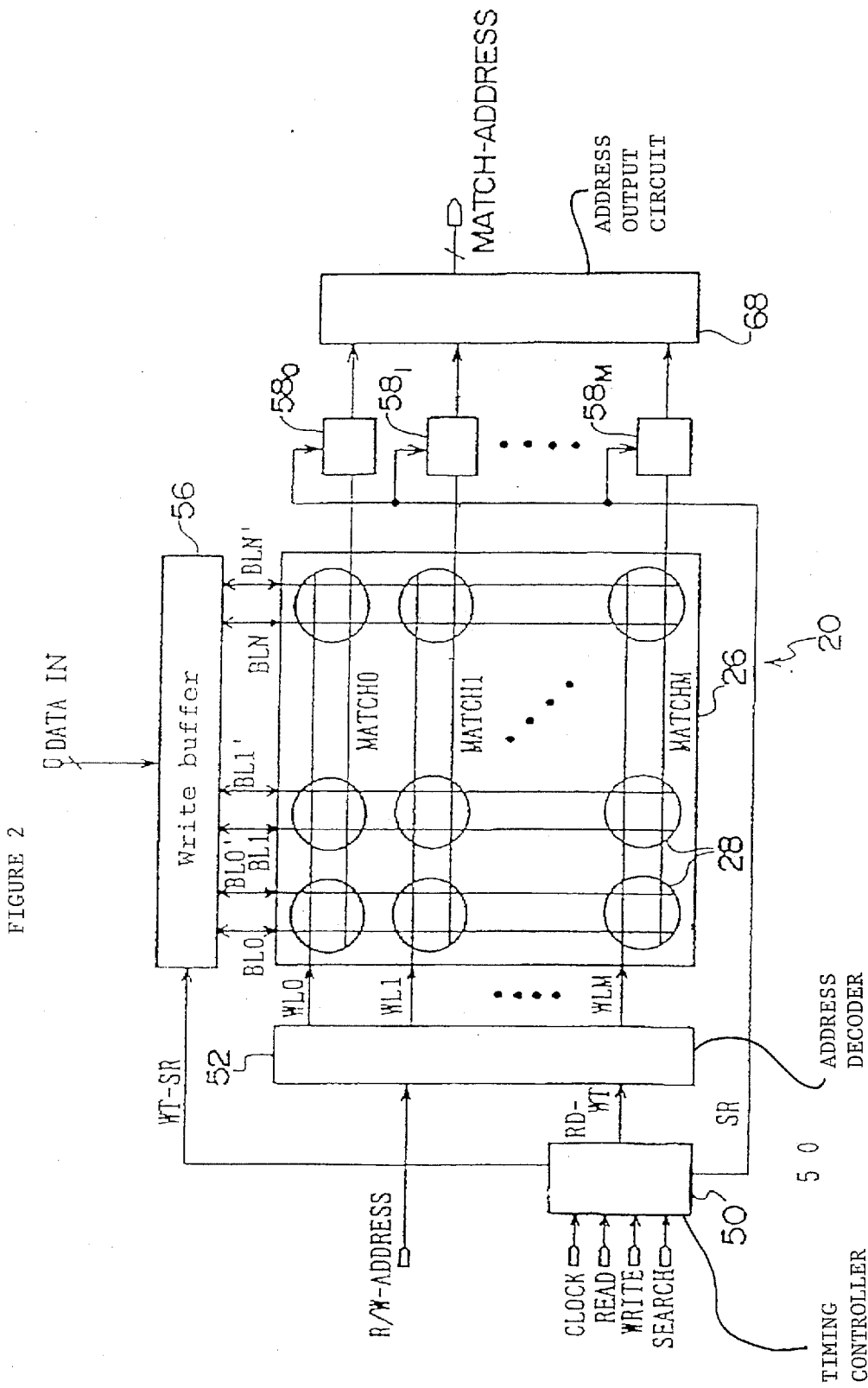
FIG. 2 is a block diagram showing the constitution of a search device.

As shown in FIG. 2, the search device 20 is provided with a content addressable memory cell array 26 in which a plurality of content addressable memory cells 28 (unit cell) shown by "O" in FIG. 2 are disposed in the form of a matrix. In the content addressable memory cell array 26, (M +1) word lines WL0 to WLM, (M+1) match-lines MATCH0 to MATCHM, and (N+1) sets of bit line pairs BL0, BL0' to BLN, BLN' are disposed in the form of a matrix, respectively. Each content addressable memory cell 28 is connected to any of the word lines WL0 to WLM, any of the match-lines MATCH0 to MATCHM, and any of the bit line pairs BL0, BL0' to BLN, BLN'.

The above-described plural content addressable memory cells 28 are identical in constitution with each other. As shown in FIG. 3, the content addressable memory cell 28 is provided with two NOT circuits 30 and 32 in which the input terminal of one circuit and the output terminal of the other circuit are connected. A loop of these NOT circuits 30 and 32 constitutes a memory circuit (SRAM type) for storing one-bit data. The output terminal of the NOT circuit 30 is connected to the source of an N-MOSFET 34, the output terminal of the NOT circuit 32 is likewise connected to the source of an N-MOSFET 36, and the gates of the N-MOSFETs 34 and 36 are connected to the word line WL.

Also, the drains of N-MOSFETs 34 and 36 are connected to the bit lines BL and BL', respectively. When one-bit data is written to the content addressable memory cell 28 (write mode to be described later), the word line WL is made a high level, the bit line BL is made a level corresponding to data D to be written (when D is a 1, the bit line BL is made a high level, and when D is a 0, the bit line BL is made a low level), and the bit line BL' is made an inverted level of the level of the bit line BL (when the bit line BL is a high level, the bit line BL' made a low level, and when the bit line BL is a low level, the bit line BL' made a high level). As a result, the N-MOSFETs 34 and 36 are switched on, and the data supplied through the bit line pair BL and BL' is held in the loop of the NOT circuits 30 and 32.

Also, the output terminal of the NOT circuit 30 is connected to the gate of an N-MOSFET 38, and the output terminal of the NOT circuit 32 is connected to the gate of an N-MOSFET 40. Note that inverted data (Q') of the data D is output from the NOT circuit 32 and inverted data Q (=D) of the data Q' is output from the NOT circuit 30. The drains of the N-MOSFETs 38 and 40 are connected to the bit lines BL' and BL, respectively, and the sources are connected to the gate of an N-MOSFET 42, which is a switching element of the present invention. The drain of the N-MOSFET 42 is connected to the match-line MATCH, and the source is connected to ground.

Note that it is assumed that in this embodiment, (N+1) content addressable memory cells 28 are connected to the same word line and match-line and (N+1)-bit data can be stored in the plural content addressable memory cells 28 connected to the same word line and match-line (hereinafter referred to as a content memory cell string). Also, in the content addressable memory cell array 26 an address is given to each content addressable memory cell string. Also, the loop of the NOT circuits 30 and 32 of each of the content addressable memory cells 28 constituting a single content addressable memory cell string corresponds to a memory element of the present invention.

On the other hand, as shown in FIG. 2, the search device 20 is provided with a timing controller 50. As an operating mode of the search device 20, there are provided a write mode of writing data to the content addressable memory cell array 26 and a search mode of searching data stored in the content addressable memory cell array 26. The timing controller 50 is connected to a controller 22. The above-described operating mode is switched according to a write instruction WRITE and a search instruction SEARCH that are input from the controller 22 to the timing controller 50.

The timing controller 50 receives a system clock CLOCK from the controller 22, and generates and outputs according to two operating modes two clock signals (clock WT-SR, clock WT) synchronized with the system clock CLOCK. In writing, the clock WT is output to an address decoder 52 connected to the timing controller 50 to operate the address decoder 52. The address decoder 52 is connected to the controller 22, by which an address (W-ADDRESS) of a content addressable memory cell string to which data is written is specified. The address decoder 52 is connected with the word lines WL0 to WLM and makes high the word line of the content addressable memory string corresponding to the specified address.

The timing controller 50 is connected with a write buffer 56, and in writing and searching, the clock WT-SR is output to the write buffer 56. The write buffer 56 is also connected to the controller 22 from which data (write data or search data (comparison data of the present invention)) is input, and the input data is temporarily stored in the write buffer 56. The write buffer 56 is connected with the bit line pairs BL0, BL', to BLN, BLN', and changes the levels of the bit line pairs BL0, BL0' to BLN, BLN' (drive the bit line pair) in accordance with the value of the above-described temporarily stored data, at the timing synchronized to the clock WT-SR input from the timing controller 50.

Figure 4A:
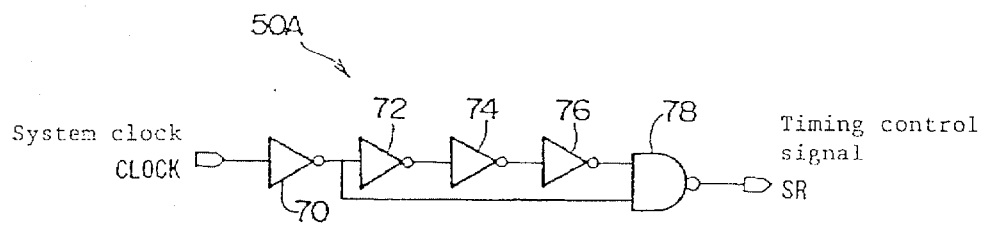
FIG. 4(A) is a circuit diagram showing an example of a signal generation circuit.

Also, the timing controller 50 has incorporated therein a signal generation circuit 50A such as that shown in FIG. 4(A). The signal generation circuit 50A is provided at its input terminal with a NOT circuit 70 to which the system clock CLOCK is input. The output terminal of the NOT circuit 70 is branched into two, one being connected to the input terminal of a NOT circuit 72 and the other being connected to one of two input terminals of a NAND circuit 78. The output terminal of the NOT circuit 72 is connected to the input terminal of a NOT circuit 74, the output terminal of the NOT circuit 74 is connected to the input terminal of a NOT circuit 76 in order, and the output terminal of the NOT circuit 76 is connected to the other of the input terminals of the NAND circuit 78. The signal generation circuit 50A is operated when the search operation is performed and outputs a timing control signal SR.

The timing controller 50 is also connected with each of (M+1) match-line controllers $58_O$ to $58_M$, which are a control circuit of the content addressable memory according to the present invention. The match-line controllers $58_O$ to $58_M$ are connected with the match-lines MATCH0 TO MATCHM, respectively, and identical in constitution with each other. To each of the match-line controllers $58_O$ to $58_M$ there is input the timing control signal SR that is generated by the signal generation circuit 50A when the search operation is performed.

As shown in FIG. 3, the match-line controller 58 is provided with an N-MOSFET 60 whose drain is connected to the match-line MATCH. The source of the N-MOSFET 60 is connected to the drain of a P-MOSFET 62 in which the source is connected to a power supply. The gates of the N-MOSFET 60 and the P-MOSFET 62 are connected to the timing controller 50 so that the above-described timing control signal SR is input. Note that the P-MOSFET 62 corresponds to first switching means, the N-MOSFET 60 to second switching means, and the signal generation circuit 50A of the timing controller 50 to third control means.

Also, the drain of the P-MOSFET 62 is connected to the input terminal of a NOT circuit 64. The output terminal of the NOT circuit 64 is connected to the gate of a P-MOSFET 66 in which the source is connected to a power supply, and the drain of the P.-MOSFET 66 is connected to the input terminal of the NOT circuit 64. These NOT circuit 64 and P-MOSFET 66 correspond to level correction means of the present invention.

As shown in FIG. 2, each of the output terminals of the match-line controllers $58_O$ to $58_M$ (output terminal of NOT circuit 64) is connected to an address output circuit 68. The address output circuit 68 is connected at its output terminal to the controller 22 so that it latches a signal which is output from each of the match-line controllers $58_O$ to $58_M$ when the search operation is performed, at a predetermined timing, and based on that level, judges a content addressable memory cell string in which the data identical with the search data input from the controller 22 to the write buffer 56 has been stored, and outputs the address of the judged content addressable memory cell string to the controller 22 as a match address MATCH-ADDRESS.

The operation of the first embodiment of the present invention will next be described with reference to the search process in the search mode. It is now assumed that data to be searched has been stored in each content addressable memory cell 28 of the content addressable memory cell array 26.

In the search process, the search instruction SEARCH and the system clock CLOCK are input from the control 22 to the search device 20 and also (N+1)-bit data to be searched are input from the controller 22 to the write buffer 56 in order. In the timing controller 50 the clock WT-SR and the timing control signal SR are generated, based on the system clock CLOCK, and the clock WT-SR is output to the write buffer 56 and the timing control signal SR is output to the match-line controller 58.

Figure 4B:
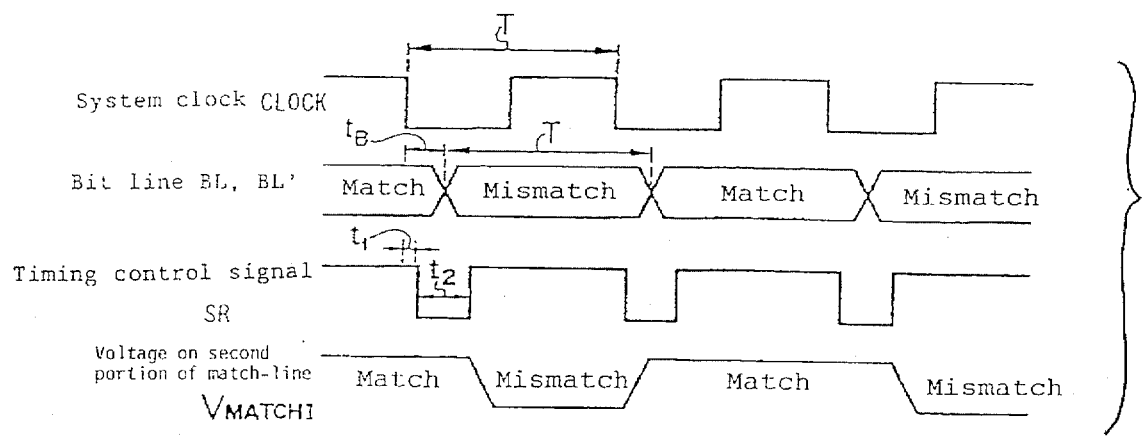
FIG. 4(B) is a timing diagram showing the timing control signal, a change in a match-line voltage $V_{MATCHI}$, etc.

In the write buffer 56 the bit line pair is driven at the timing synchronized to the clock WT-SR. More particularly, as shown in FIG. 4(B), the drive corresponding to predetermined search data is started after a predetermined time $t_B$ elapses from the fall of the pulse of the system clock CLOCK, and this state continues until a time T corresponding to one cycle of the system clock CLOCK elapses. During this, the next search data is input from the controller 22 to the write buffer 56. In searching, the address decoder 52 is not operated and all of the word lines WL0 to WLM are made a low level, so the levels of the bit line pair that have changed according to the search data are fetched in the content addressable memory cell 28. That is, no search data is written to the content addressable memory cell 28.

On the other hand, in each content addressable memory cell 28 of the content addressable memory cell array 26, the N-MOSFET 38 is on if the data Q output from the NOT circuit 30 is a 1 (high level) and the N-MOSFET 40 is on if the data Q' output from the NOT circuit 32 is a 1. Therefore, when the data Q (Q') held in the loop of the NOT circuits 30 and 32 has been matched with the data D (D') supplied through the bit line pair BL and BL', by the drive of the bit line pair by the write buffer 56, the N-MOSFET 42 is switched off, and when they have been mismatched, current flows from the drain of one of the N-MOSFETs 38 and 40 that has been on to the source, so the N-MOSFET 42 is switched on.

The on or off of the N-MOSFET 42 in accordance with the result of comparison between the data Q (Q') and the data D (D') continues during the period that the bit line pair is being driven according to predetermined search data by the write buffer 56, as shown by "MATCH" and "MISMATCH" of the bit line pair BL, BL' in FIG. 4(B).

On the other hand, from the NAND circuit 78 of the signal generation circuit 50A there is generated the timing control signal SR, which goes to a low level after a predetermined delay time $t_1$ in the NOT circuit 70 elapses from the fall of the pulse of the system clock CLOCK and goes to a high level after the sum $t_2$ of the delay times of the NOT circuits 72, 74, and 76 elapse.

If this timing control signal SR is input to the match-line controllers $58_O$ to $58_M$ (these match-line controllers will hereinafter be described as a match-line controller 58 because they are identical in operation), the timing control signal SR will go to a low level at the time the system clock CLOCK falls and then a time $t_1$ has elapsed, so the P-MOSFET 62 is switched on and the N-MOSFET 60 is switched off. As a result, the portion (second portion) on the side of the NOT circuit 64 of the match-line with the N-MOSFET 60 as a boundary is charged, and the voltage $V_{MATCHI}$ on the second portion of the match-line is pulled up to the power supply voltage $V_{DD}$.

The low level state of this timing control signal SR continues until the time $t_2$ elapses, but the drive of the bit line pair BL and BL' corresponding to predetermined search data is started by the write buffer 56 during the time $t_2$, as shown in FIG. 4(B), and the N-MOSFET 42 of each content addressable memory cell 28 is switched on or off according to a result of comparison, as described above. If the time $t_2$ elapses after the timing control signal SR has gone to a low level, the timing control signal SR will go to a high level. As a result, the P-MOSFET 62 is switched off and the N-MOSFET 60 is switched on, so current flows to the portion (first portion) on the side of the content addressable memory cell 28 of the match-line with the N-MOSFET 60 as a boundary.

Now, when a result of comparison has been "match" for each of the plural content addressable memory cells 28 constituting the content addressable memory cell string (when the data stored in the content addressable memory cell string has been matched with the search data), the voltage $V_{MATCH}$ on the first portion increases up to a voltage level slightly lower than the power supply voltage $V_{DD}$ because each of the N-MOSFETs 60 of the above-described plural content addressable memory cells 28 has been switched off. The voltage $V_{MATCH}$ on the first portion is lower than the power supply voltage $V_{DD}$ because of the voltage drop $V_{tn}$, the threshold voltage of the N-MOSFET 60. The voltage $V_{MATCH}$ on the first portion as the result of comparison is "match" for each content addressable memory cell 28 becomes:

$$V_{MATCH}=V_{DD}-V_{tn}$$

Also, when the comparison result is "mismatch" for some of the plural content addressable memory cells 28 constituting the content addressable memory cell string, the electric charge stored in the second portion of the match-line will flow through the N-MOSFET 42 being on to the ground terminal if the N-MOSFET 60 is switched on, because the N-MOSFET 42 of the content addressable memory cell 28 in which the comparison result is "mismatch" has been on, and the voltage $V_{MATCH}$ on the first portion and the voltage $V_{MATCHI}$ on the second portion will be reduced to the ground level. As described hereinbefore, the P-MOSFET 62 has been off at that time, so no through current flows from the power supply to the ground terminal through the P-MOSFET 62, and power is prevented from being dissipated wastefully by the through current.

Figure 24:
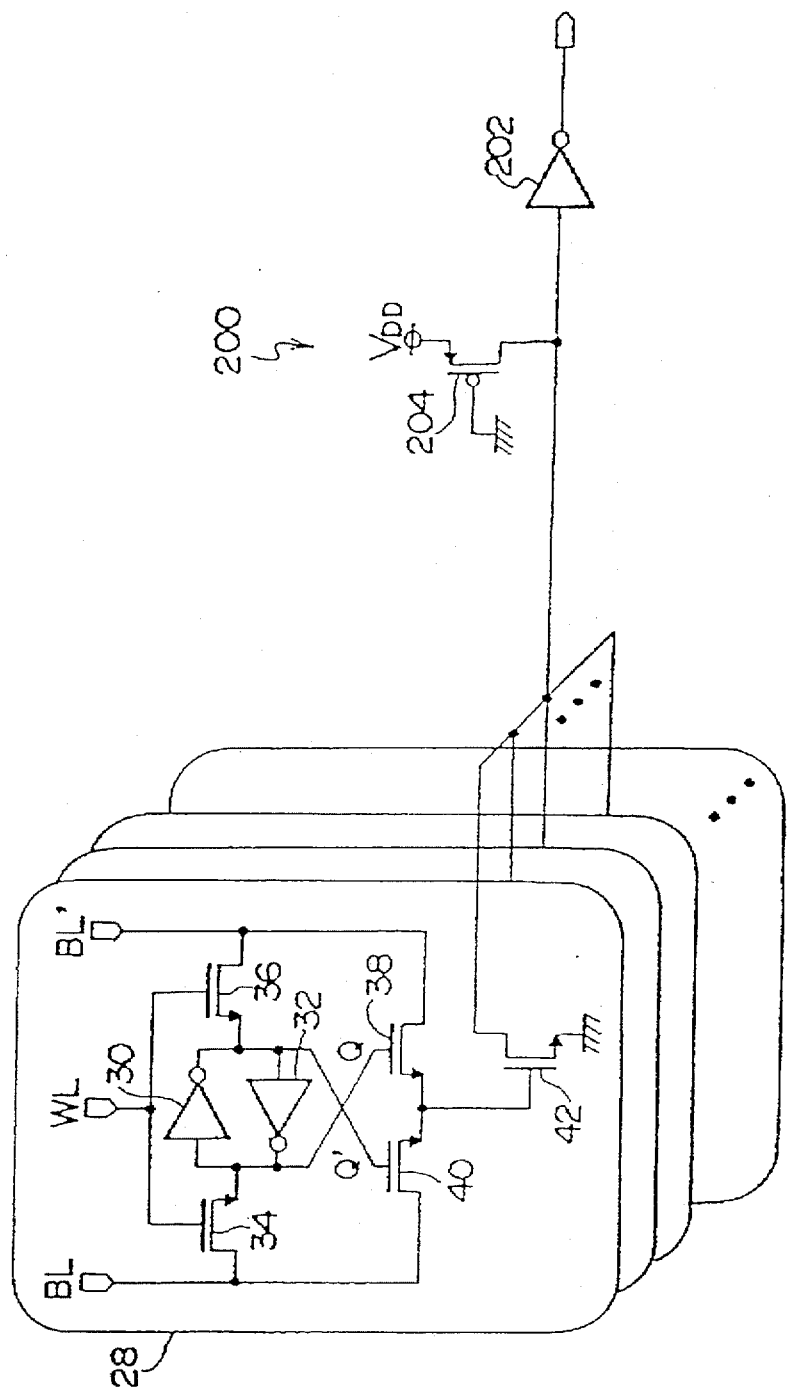
FIG. 24 is a circuit diagram showing the constitution of a conventional match-line controller.

Also, since the voltage $V_{MATCH}$ on the first portion of the match-line will be made ($V_{DD}-V_{tn}$) if the data stored in the content addressable memory cell string has matched with the search data and will be made the ground level (normally 0 V) if "mismatch," the amplitude of a change in the voltage $V_{MATCH}$ is $V_{DD}-V_{tn}$. Therefore, the amplitude of a change in the voltage on the match-line is small as compared with that of the conventional method shown in FIG. 24, so power dissipation can be reduced by the N-MOSFET 42 existing on the first portion.

Incidentally, the voltage $V_{MATCH}$ on the first portion of the match-line as the N-MOSFET 60 is switched on depends upon a previous comparison result, so it has been $V_{DD}-V_{tn}$ if a previous comparison result is "match" and the ground level if a previous comparison result is "mismatch." Now, in a case where the voltage $V_{MATCH}$ on the first portion has been the ground level, a difference in voltage between the first and second portions of the match-line is large, so the voltage $V_{MATCHI}$ would be reduced even if a current comparison result were "match," if the N-MOSFET 60 is switched on. However, in the first embodiment of the present invention a reduction in this voltage is corrected by a half-latch comprising the NOT circuit 64 and the P-MOSFET 66.

That is, the Voltage $V_{MATCHI}$ on the second portion of the match-line is higher than a threshold value at which the output of the NOT circuit 64 is inverted, a signal to be output by the NOT circuit 64 will hold a low level. As a result, the P-MOSFET 66 is switched on and the power supply voltage $V_{DD}$ on the second portion of the match-line is pulled up. Also, if a current comparison result is "mismatch," at least any of the N-MOSFETs 42 of the plural content addressable memory cells 28 constituting a content addressable memory cell string will be switched on, and the voltage $V_{MATCHI}$ on the second portion and the voltage $V_{MATCH}$ on the first portion will be reduced rapidly to the ground level lower than the threshold value of the NOT circuit 64, so a signal to be output by the NOT circuit 64 goes to a high level, the P-MOSFET 66 is switched off, and the pull-up of the second portion is stopped. Consequently, the through current is prevented from flowing through the P-MOSFET 66.

Each content addressable memory cell string compares the stored data with the data input in sequence to the write buffer 56 and repeats switching on or off the N-MOSFET 42 according to the comparison result, and the match-line controllers $58_O$ to $58_M$ repeat the above-described operation and then output signals each representative of a comparison result (signal to be output from the NOT circuit 64) to the address output circuit 68.

The address output circuit 68 judges the level on a signal input from each of the match-line controllers $58_O$ to $58_M$. And, if the level on the input signal from the match-line controller 58 has a content addressable memory cell string which is a low level, the address output circuit 68 will judge that the comparison result in that content addressable memory cell string is "match" and output an address of that content addressable memory cell string to the controller 22 as a match address MATCH-ADDRESS. Note that when the comparison results in plural content addressable memory cell strings are "match", any of the content addressable memory cell strings is selected according to a predetermined criterion (for example, a content addressable memory cell string whose address is lowest is selected) and an address of the selected content addressable memory cell string is output.

While in the above-described embodiment there has been used the content addressable memory cell 28 in which the match-line is made a high level when a result of comparison is "match" and a low level when a result of comparison is "mismatch," it is also possible to use a content addressable memory cell in which the match-line is made a low level when a result of comparison is "match" and a high level when a result of comparison is "mismatch." This content addressable memory cell will hereinafter be referred to as a reverse-polarity content addressable memory cell.

Figure 5:
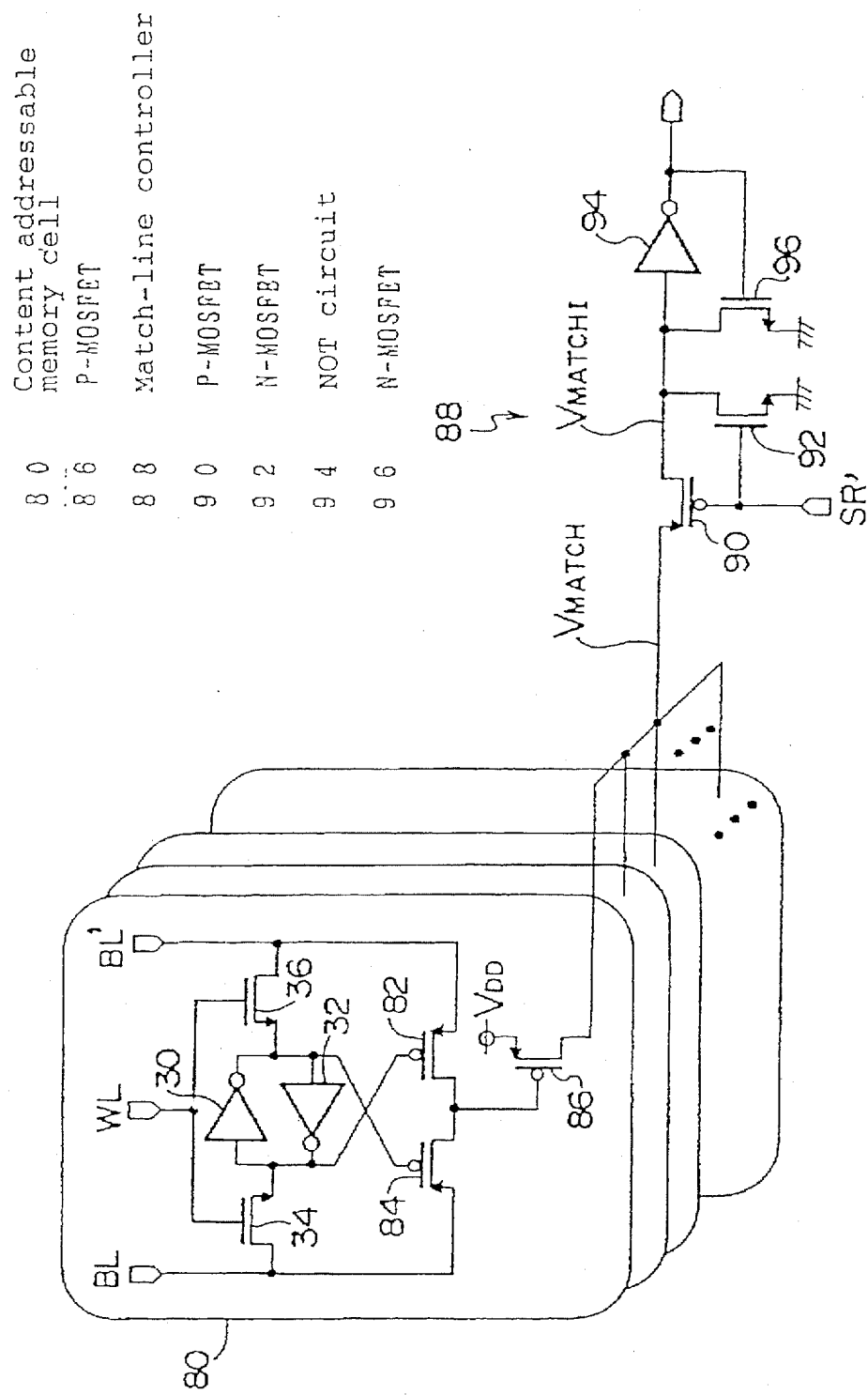
FIG. 5 is a circuit diagram showing an example of a content addressable memory cell of reverse polarity and a match-line controller that is connected to this content addressable memory cell.

As shown in FIG. 5, the reverse-polarity content addressable memory cell 80 is provided with P-MOSFETs 82, 84, and 86 instead of the N-MOSFETs 38, 40, and 42. The source of the P-MOSFET 86 is connected to a power supply and the drain is connected to the match-line. The P-MOSFET 86 is switched off when a result of comparison between the data stored in the content addressable memory 80 and the search data input through the write buffer 56 is "match." When the comparison result is "mismatch," the P-MOSFET 86 is switched on so that the match-line can be pulled up to the power supply voltage A match-line controller 88 to be connected to this reverse-polarity content addressable memory cell 80 is provided with a P-MOSFET 90 whose source is connected to the match-line. The drain of the P-MOSFET 90 is connected to the drain of an N-MOSFET 92 in which the source is connected to ground. The gates of the P-MOSFET 90 and the N-MOSFET 92 are connected to the timing controller 50 so that the timing control signal SR', which is an inverse of the above-described timing control signal SR, can be input. Also, the drain of the N-MOSFET 92 is connected to the input terminal of a NOT circuit 94. The output terminal of the NOT circuit 94 is connected to the gate of an N-MOSFET 96 whose source is connected to ground, and the drain of the N-MOSFET 96 is connected to the input terminal of the NOT circuit 94.

Note that the N-MOSFET 92 corresponds to first switching means, the P-MOSFET 90 to second switching means, the timing controller to third control means, and the NOT circuit 94 and N-MOSFET 96 to level correction means. This match-line controller 88 and the reverse-polarity content addressable memory cell 80 are different from the match-line controller 58 and content addressable memory cell 28 in the level on the match-line but almost identical in operation.

That is, if the timing control signal SR' goes to a high level, the N-MOSFET 92 will be switched on and the P-MOSFET 90 will be switched off. As a result, the portion (second portion) on the side of the NOT circuit 94 of the match-line with P-MOSFET 90 as a boundary is pulled down to the ground level. Also, during the time the timing control signal SR' is a high level, the bit line pair BL and BL' are driven according to the search data by the write buffer 56 so that the P-MOSFET 84 of each content addressable memory cell 80 is switched on or off. If the P-MOSFET 84 is switched on, the portion (first portion) on the side of the content addressable memory cell 80 of the match-line with the P-MOSFET 90 a boundary will be pulled up to a level slightly lower than the power supply voltage $V_{DD}$.

Thereafter, if the timing control signal SR goes to a low level, the N-MOSFET 92 will be switched off, the P-MOSFET 90 will be switched on, the first and second portions of the match-line will electrically be connected. Now, when the comparison result is "mismatch" for some of the plural content addressable memory cells 80 constituting the content addressable memory cell string, the voltage $V_{MATCHI}$ on the second portion increases up to the power supply voltage $V_{DD}$ because the P-MOSFET 84 of the content addressable memory cell 80 in which the comparison result is "mismatch" is switched on.

Also, when the comparison result is "match" for each of the plural content addressable memory cells 80 constituting the content addressable memory cell string, the voltage $V_{MATCHI}$ on the second portion would hold almost the ground level even if the P-MOSFET 90 were switched on. Since the N-MOSFET 92 has been switched off at that time, no through current flows from the power supply to the ground terminal through the N-MOSFET 92, and power is prevented from being dissipated wastefully by a through current. Note that if the threshold voltage of the P-MOSFET 90 is made $V_{tp}$, the voltage on the first portion of the match-line at that time will become higher with respect to the ground level by $-V_{tp}$. Therefore, the amplitude of a change in the voltage $V_{MATCH}$ on the first portion is ($V_{DD}$ to $-V_{tp}$) and small as compared with the amplitude $V_{DD}$ of a change in the voltage on the match-line in the conventional circuit shown in FIG. 24, so power dissipation can be reduced by the P-MOSFET 84 existing on the first portion.

Also, if the voltage $V_{MATCHI}$ on the second portion of the match-line is lower than a threshold value at which the output of the NOT circuit 94 is inverted, a signal to be output by the NOT circuit 94 will hold a low level. As a result, the N-MOSFET 96 is switched on and the voltage $V_{MATCHI}$ on the second portion is pulled down to the ground level. Also, if a comparison result is "mismatch," at least any of the P-MOSFETs 84 of the plural content addressable memory cells 80 constituting a content addressable memory cell string will be switched on, and the voltage $V_{MATCH}$ on the first portion and the voltage $V_{MATCHI}$ on the second portion will also be pulled up to the power supply voltage $V_{DD}$, so a signal to be output by the NOT circuit 94 goes to a low level, the N-MOSFET 96 is switched off, and the pull-down of the second portion is stopped. Consequently, a through current is prevented from flowing through the N-MOSFET 96.

Note that a signal generation circuit to be incorporated into the timing controller 50 is not limited to the constitution shown in FIG. 4. For example, when search data is input from the controller 22 to the write buffer 56 in asynchronization, a signal generation circuit 50B such as that shown in FIG. 18(A) may be used. The signal generation circuit 50A has an input terminal to which the bit line signal BL (voltage level on the bit line BL) is input and to which one of two input terminals of a NOR circuit 126, an input terminal of a NOT circuit 120, and one of two input terminals of an AND circuit 128 are connected.

The output terminal of the NOT circuit 120 is connected to the input terminal of a NOT circuit 122, the output terminal of the NOT circuit 122 is connected to the input terminal of a NOT circuit 124, and the output terminal of the NOT circuit 124 is connected to the other input terminal of the NOR circuit 126 and the other input terminal of the AND circuit 128. Also, the output terminal of the NOR circuit 126 is connected to one of two input terminals of a NOR circuit 130, and the output terminal of the AND circuit 128 is connected to the other input terminal of the NOR circuit 130. From the output terminal of the NOR circuit 130 the timing control signal SR is output.

Figure 18A:
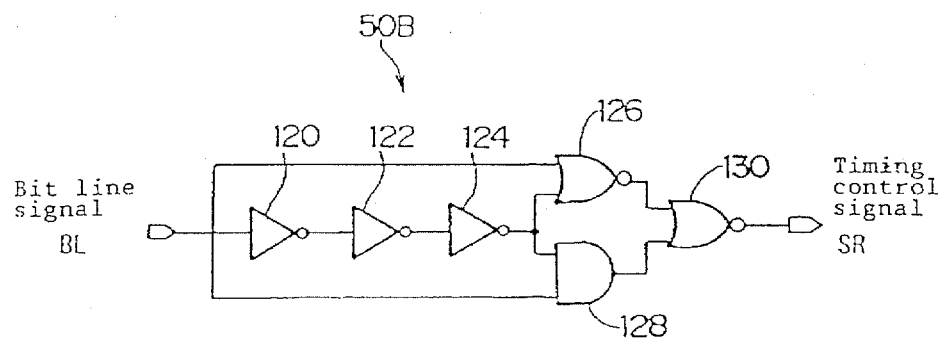
FIG. 18(A) is a circuit diagram showing an example of the signal generation circuit.
Figure 18B:
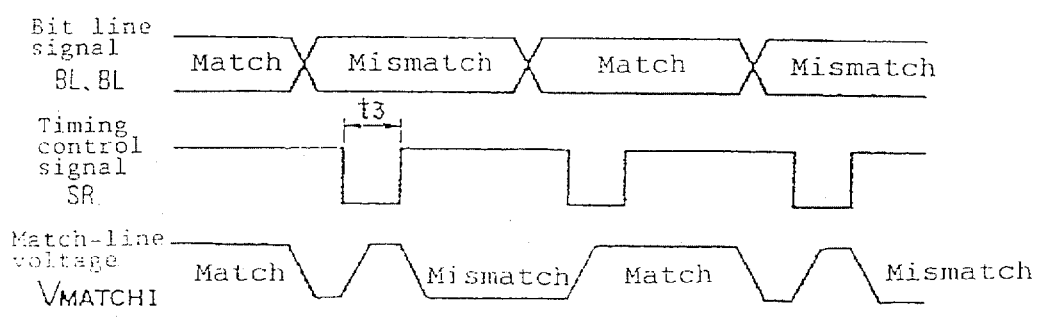
FIG. 18(B) is a timing diagram showing the timing control signal, the change in a match-line voltage $V_{MATCHI}$, etc.

By the above-described constitution, a timing control signal SR which is a high level until the sum $t_3$ of the signal delay times of the NOT circuits 120, 122, and 124 elapses after the change on the level of the bit line signal BL and which goes to a low level thereafter is generated as shown in FIG. 18(A). In a case where this timing control signal SR is used, unnecessary charge and discharge of the match-line occur when a result of comparison is "mismatch," as shown in FIG. 18(B), but no problem in operation will occur if in the address output circuit 68 the timing control signal SR is latched after it has returned back to a high level.

However, from the standpoint of power dissipation, the bit line pair BL and BL' are preferable to be driven according to new search data during the time the timing control signal SR is a low level (for the timing control signal SR', high level), by delaying a signal for driving the bit line BL which is input to the timing controller 50, with a delay circuit, and inputting the delayed signal to the write buffer 56 as a signal WT-SR, as shown in FIG. 4.

Second Embodiment

Figure 6:
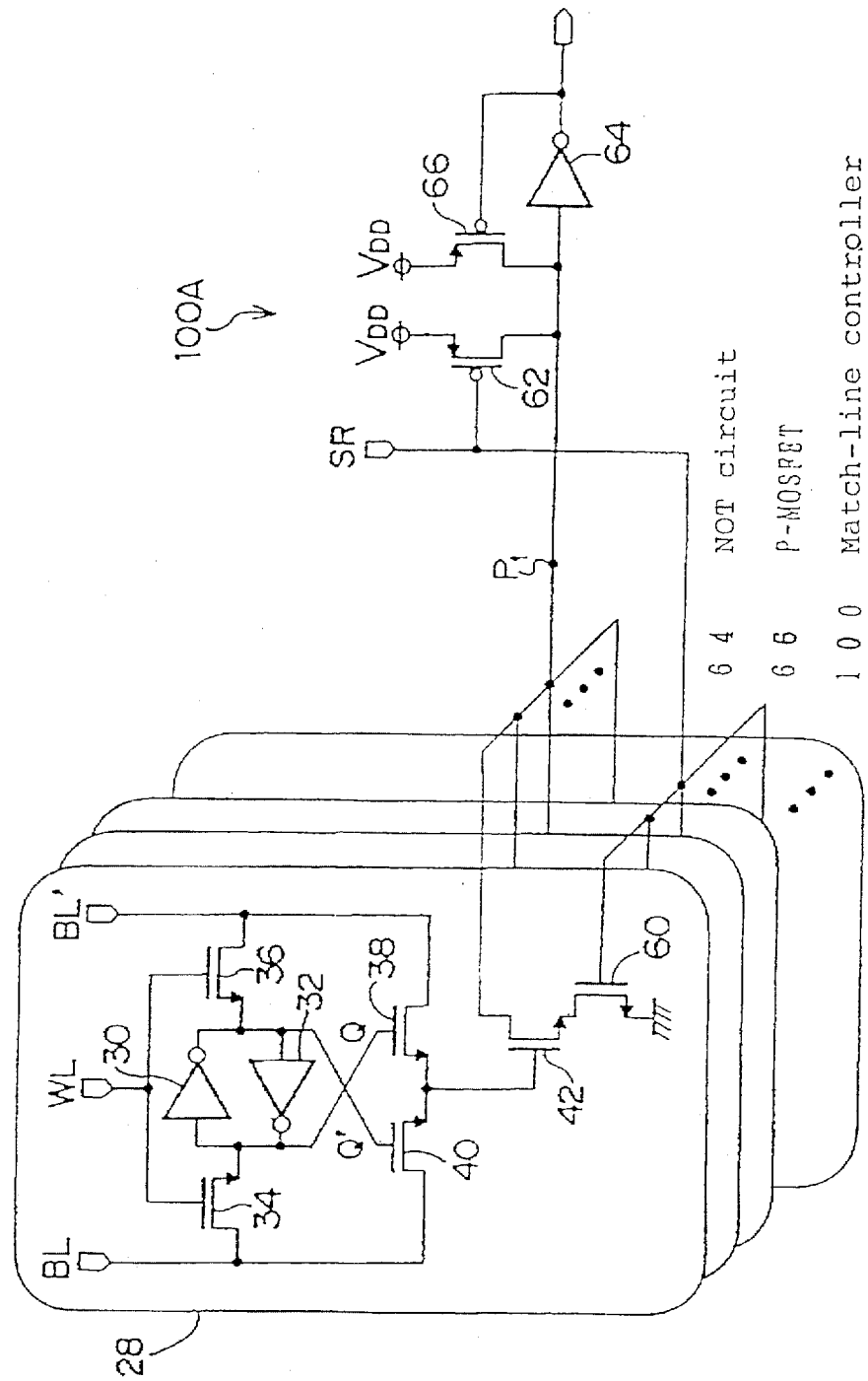
FIG. 6 is a circuit diagram showing a match-line controller according to a second embodiment.

The second embodiment of the present invention will hereinafter be described. Note that the same reference numerals will be applied to the same parts as the first embodiment and a description of the same parts will not be given. As shown in FIG. 6, in a match-line controller 100A of the second embodiment corresponding to the match-line controller 58 shown in FIG. 3, an N-MOSFET 60 is provided between the source of an N-MOSFET 42 of a content addressable memory cell 28 and a ground terminal.

In the match-line controller 100A, if the timing control signal SR goes to a low level and the P-MOSFET 62 is switched on and the N-MOSFET 60 off, the portion of the match-line between the input terminal of the NOT circuit 64 and the drain of the N-MOSFET 60 will be pulled up to the power supply voltage $V_{DD}$. And, if the timing control signal SR goes to a high level and the P-MOSFET 62 is switched off and the N-MOSFET 60 on, the voltage on the portion of the match-line between the input terminal of the NOT circuit 64 and the drain of the N-MOSFET 42 will be held $V_{DD}$ because the N-MOSFET 42 has been switched off if a comparison result is "match," and a signal to be output from the NOT circuit 64 will go to a high level. Also, if a comparison result is "mismatch," the entire match-line will be reduced to the ground level because the N-MOSFET 42 has been switched on. Since the P-MOSFET 62 has been off at that time, a through current is prevented from flowing from the power supply to the ground terminal through the P-MOSFET 62.

Note that in the above-described match-line controller 100A, each content addressable memory cell 28 requires the N-MOSFET 60, so the number of elements constituting a circuit is increased, as compared with the match-line controller 58 of the first embodiment, and the degree of integration of an integrated circuit is slightly reduced.

Also, since the voltage on the match-line changes between 0 and $V_{DD}$, power dissipation is slightly increased as compared with that of the match-line controller 58 of the first embodiment. Also, a parasitic capacitance is large because (N+1) N-MOSFETs 60 of the content addressable memory are connected to the match-line, and the rise speed of an voltage level on the match-line as a previous comparison result is "mismatch" and a current comparison result is "match" becomes low. To improve this, it is preferable that a MOSFET connected so as to be normally on be provided on the match-line (e.g., position of $P_1$ shown in FIG. 6) between the drain of the P-MOSFET 62 and the drain of the N-MOSFET 42 of the content addressable memory cell 28. This MOSFET will hereinafter be referred to as a voltage drop element.

Therefore, the voltage on the portion on the side of the content addressable memory cell 28 of the match-line with the voltage drop element as a boundary changes between ($V_{DD}-V_m$) and 0 when the voltage drop element is an N-MOSFET and between $V_{DD}$ and $V_{tp}$ when the voltage drop element is a P-MOSFET, so the amplitude of a change in the voltage becomes small and power dissipation can be reduced. Also, by the internal resistance of the MOSFET, the parasitic capacitance of the portion on the side of the content addressable memory cell 28 of the match-line with the MOSFET as a boundary disappears from the portion on the side of the pull-up means from the portion on the side of the NOT circuit 64 with the voltage drop element as a boundary, so the pull-up of the portion on the side of the NOT circuit 64 with the MOSFET as a boundary becomes fast.

Also, in a case where a general electric resistance element is used instead of the above-described voltage drop element, the amplitude of a change in the voltage on the above-described portion on the side of the content addressable memory cell 28 does not become smaller, but advantageously the pull-up of the portion on the side of the NOT circuit 64 of the match-line becomes faster.

Figure 7:
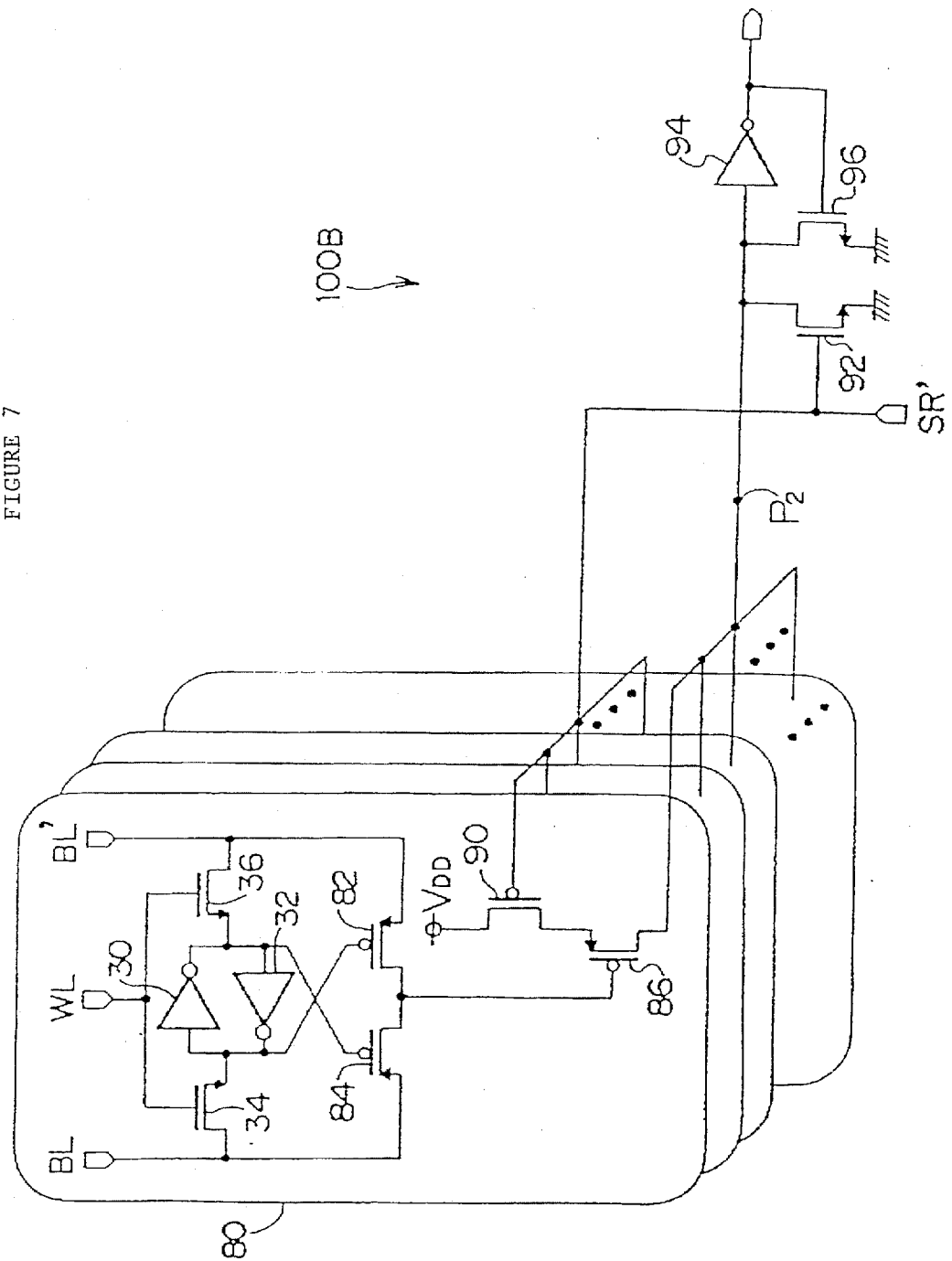
FIG. 7 is a circuit diagram showing another example of the match-line controller that is connected to the content addressable memory cell of reverse polarity.

Note that in the match-line controller 88 connected to the reverse-polarity content addressable memory cell 80 of FIG. 5, it is also possible to dispose a P-MOSFET 90 in the same position as the N-MOSFET 60 of the match-line controller 100A (FIG. 7). That is, in the match-line controller 100B shown in FIG. 7, the P-MOSFET 90 is provided between the source of the P-MOSFET 86 of the content addressable memory cell 80 and the power supply.

This constitution can also prevent a through current. Also, if a MOSFET connected so as to be normally on is provided on the match-line (e.g., position of P2 shown in FIG. 7) between the drain of the N-MOSFET 92 and the drain of the P-MOSFET 86 of the content addressable memory cell 80, the amplitude of a change in the voltage on the first portion on the side of the content addressable memory cell 80 of the match-line with the MOSFET as a boundary will become smaller, so power dissipation can be reduced.

Third embodiment

Figure 8:
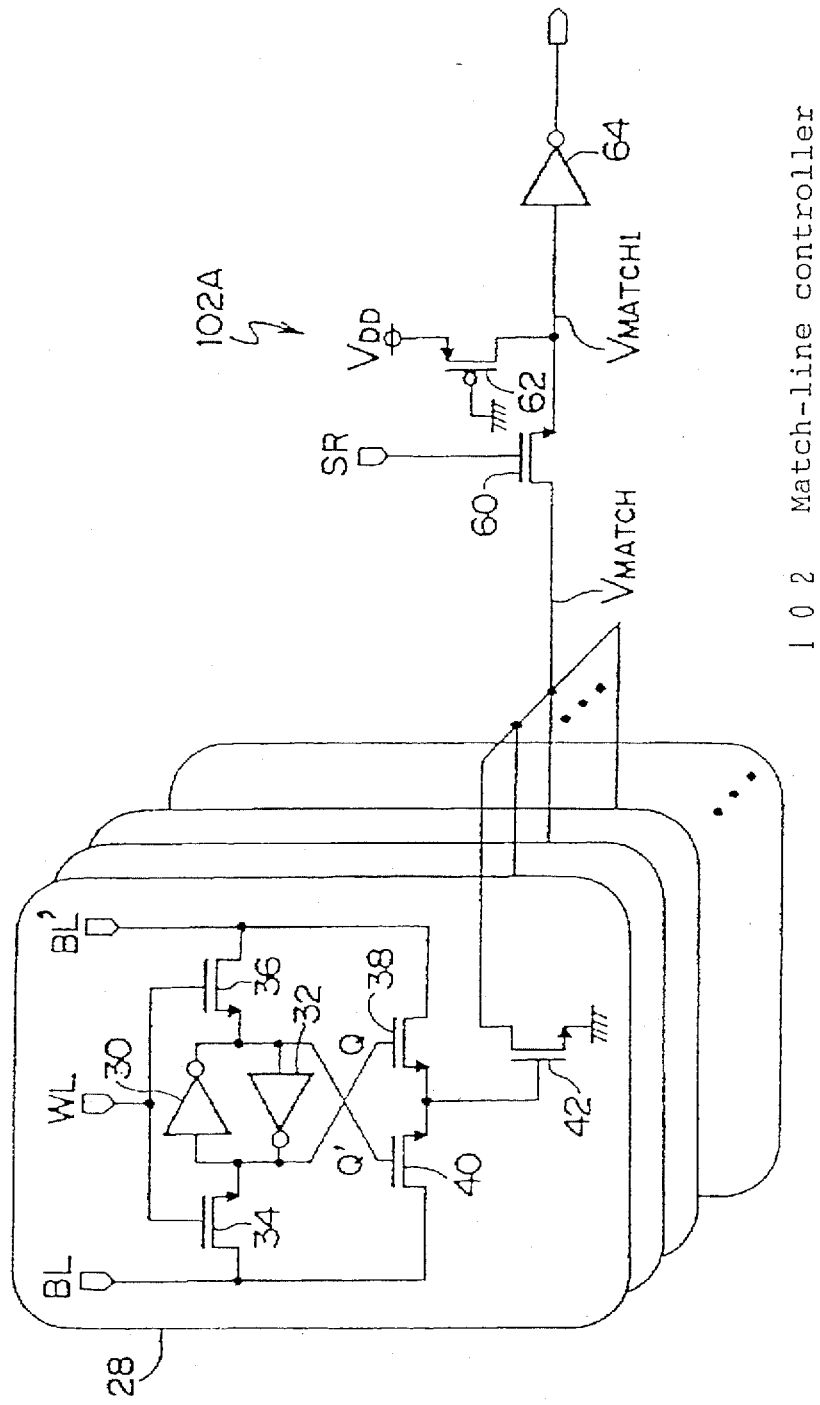
FIG. 8 is a circuit diagram showing a match-line controller according to a third embodiment.

The third embodiment of the present invention will hereinafter be described. Note that the same reference numerals will be applied to the same parts as the first and second embodiments and a description of the same parts will not be given. As shown in FIG. 8, in a match-line controller 102A of the third embodiment corresponding to the match-line controller 58 shown in FIG. 3, the gate of a P-MOSFET 62 is connected to ground and the timing control signal SR is input only to the gate of an N-MOSFET 60.

In the match-line controller 102A, since the P-MOSFET 62 has normally been on, the voltage $V_{MATCHI}$ on the second portion on the side of a NOT circuit 64 of the match-line with the N-MOSFET 60 as a boundary has always been pulled up to a power supply voltage $V_{DD}$. And, if the timing control signal SR goes to a high level and the N-MOSFET 60 is switched on, the voltage $V_{MATCH}$ on the portion on the side of an content addressable memory cell 28 of the match-line with the N-MOSFET 60 as a boundary will be pulled up to ($V_{DD}-V_m$) when each of the N-MOSFETs 42 of each content addressable memory cell 28 of the content addressable memory cell string is off. Also, when the N-MOSFETs 42 of some of the content addressable memory cells 28 of the content addressable memory cell string are on as the N-MOSFET 60 is on, the voltages $V_{MATCH}$ and $V_{MATCHI}$ are reduced to the ground level and then a through current is to flow by way of the P-MOSFET 62.

Therefore, the timing control signal SR (FIG. 9) of the third embodiment, as compared with the timing control signal SR shown in FIG. 4, is the same in that it is high during a partial period within the period that the content addressable memory cell 28 switches on or off the N-MOSFET 42 according to a search result, but the period that the signal SR is high is shortened. As a result, the period that the through current flows becomes shorter, and the power to be wastefully dissipated by the through current is reduced. Also, the voltage $V_{MATCH}$ changes between ($V_{DD}-V_m$) and 0, so the amplitude of a change is small as compared with the prior art, and from this point, power dissipation is also reduced.

Figure 9:
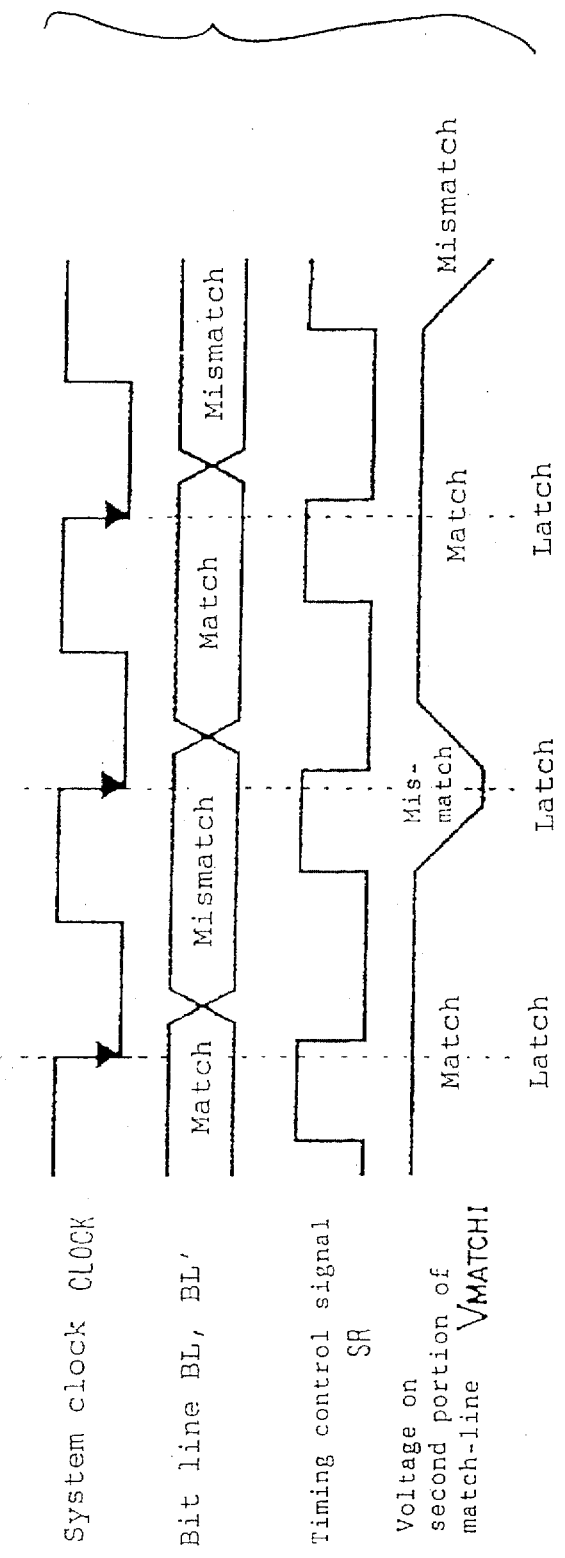
FIG. 9 is a timing diagram showing the timing control signal, change in a match-line voltage $V_{MATCHI}$, and signal latch timing in the circuit of FIG. 8.

Note that when a previous comparison result is "mismatch," it takes a little time for the voltage $V_{MATCH}$ to be pulled up and become stable, because the $V_{MATCH}$ is reduced to the ground level when the N-MOSFET 60 is switched on. For this reason, a signal output from the match-line controller 102A is latched by the address output circuit 68 at the time a predetermined time has elapsed after the high level of the timing control signal SR, as shown in FIG. 9. FIG. 9 shows an example of latching by the address output circuit 68 in synchronization with the fall of the pulse of the system clock CLOCK.

Figure 10:
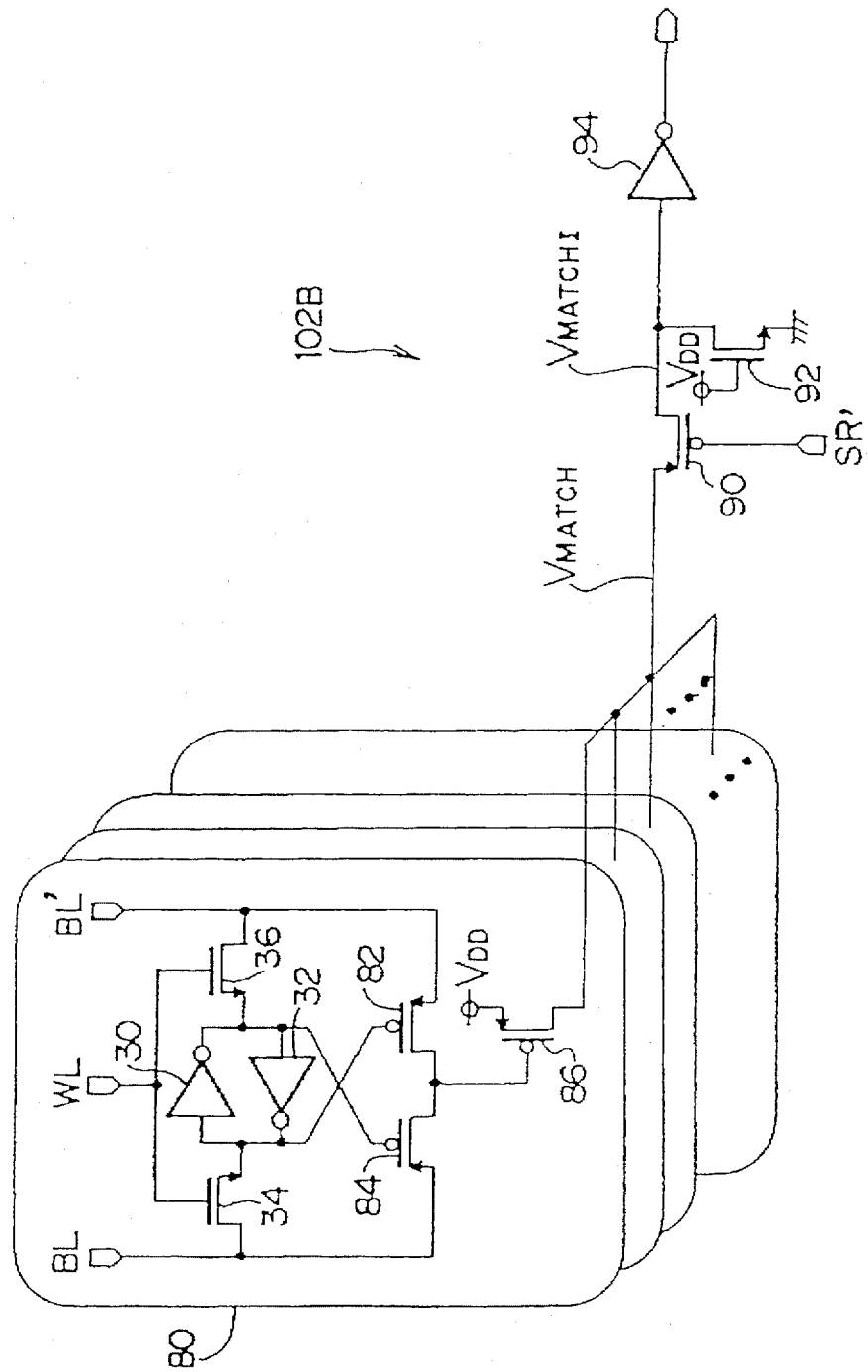
FIG. 10 is a circuit diagram showing another example of the match-line controller that is connected to the content addressable memory cell of reverse polarity.

Note that in the match-line controller 88 connected to the reverse-polarity content addressable memory cell 80 of FIG. 5, a match-line controller 102B (FIG. 10) may be constituted such that, as in the above case, an N-MOSFET 92 is normally switched on and a timing control signal SR' is input only to the gate of a P-MOSFET 90. As the timing control signal SR', there can be used a signal which is an inverse of the timing control signal SR shown in FIG. 9. This constitution can also shorten the period that a through current flows and reduce power that is wastefully dissipated by a through current.

Figure 11:
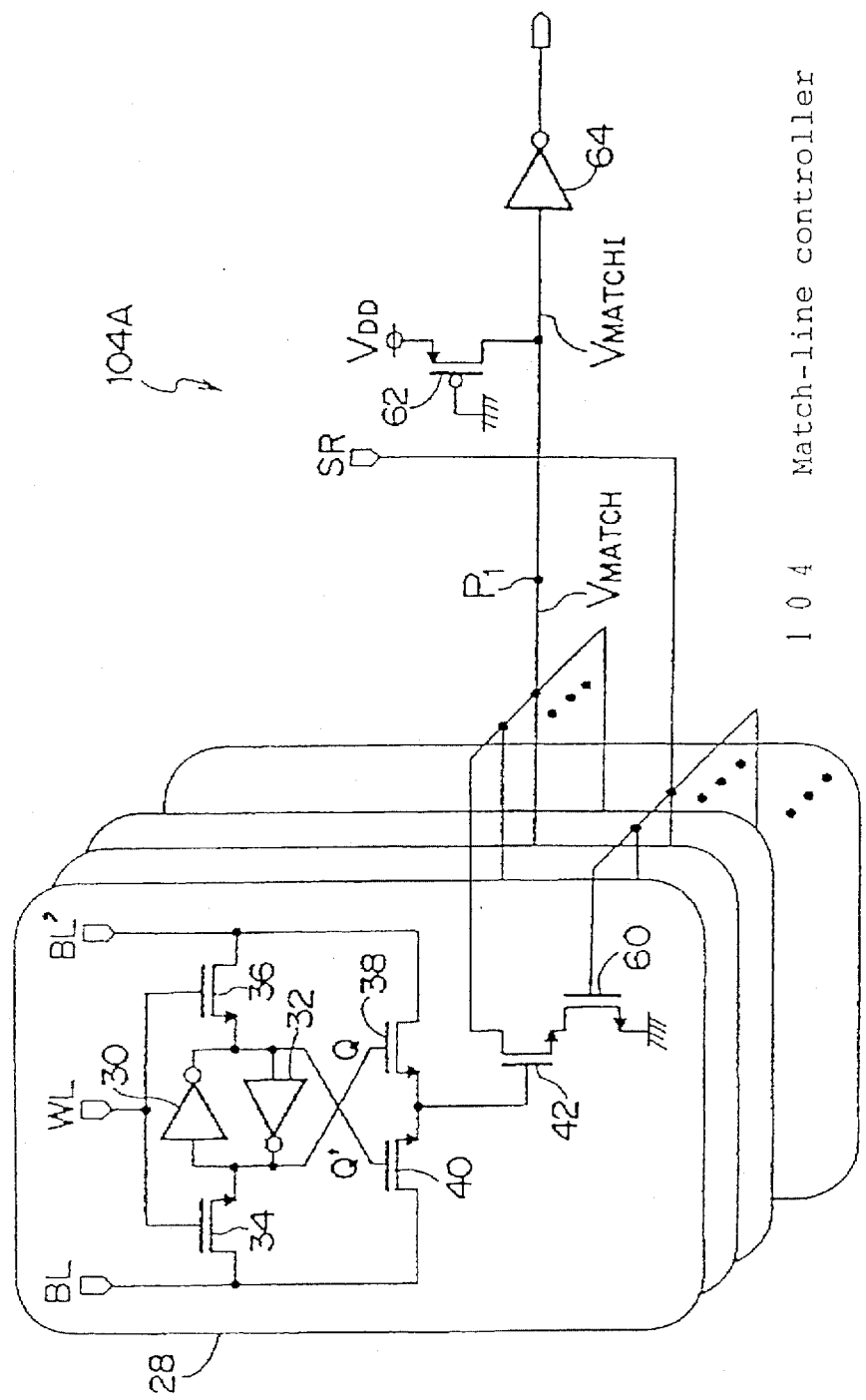
FIG. 11 is a circuit diagram showing another example of the match-line controller.
Figure 12:
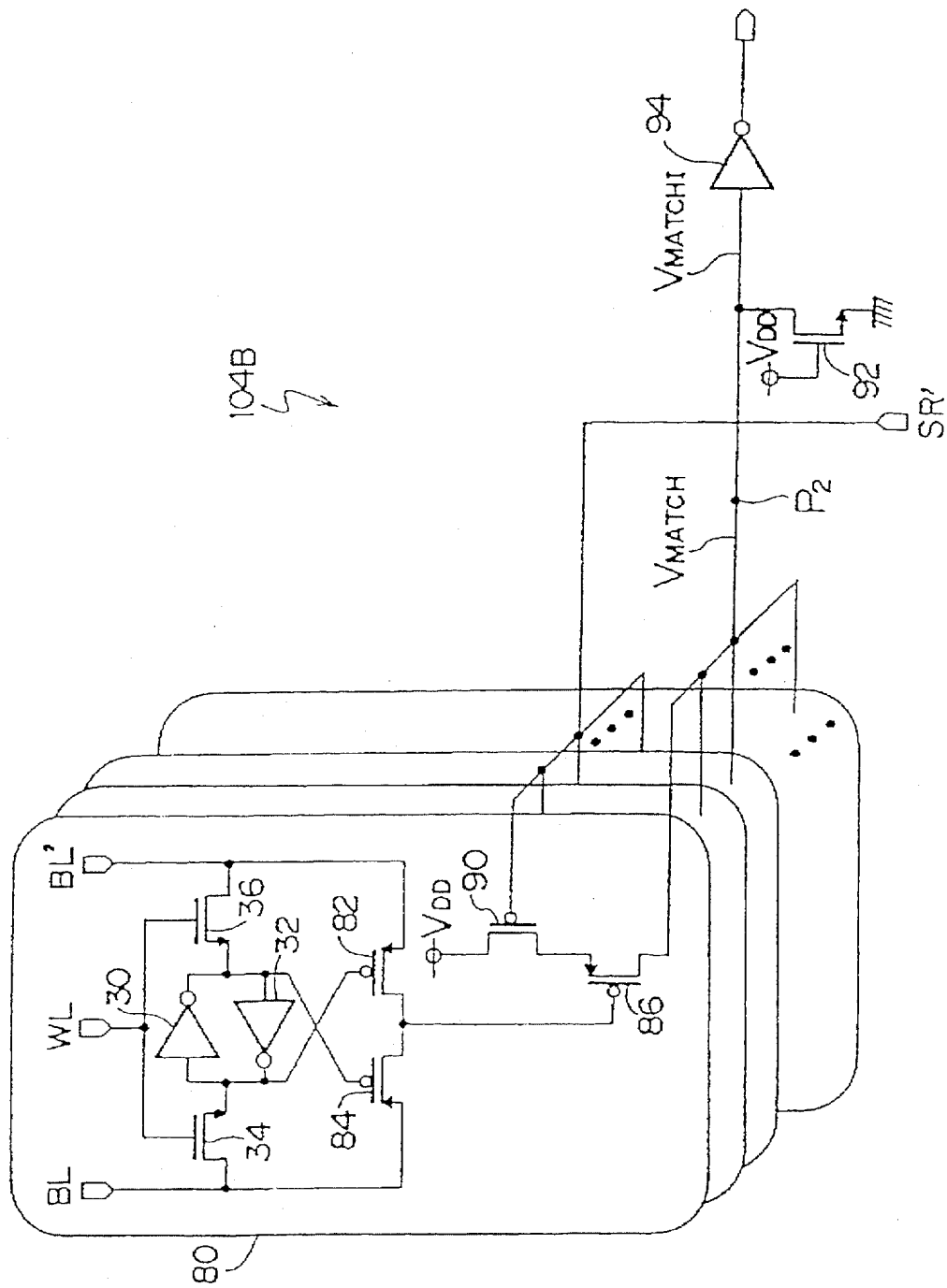
FIG. 12 is a circuit diagram showing another example of the match-line controller that is connected to the content addressable memory cell of reverse polarity.

Also, in the circuit shown in FIG. 8, an N-MOSFET 60 may be provided between the source of the content addressable memory cell 28 and the ground terminal (FIG. 11). Likewise, in the circuit shown in FIG. 10, a P-MOSFET 90 may be provided between the source of a P-MOSFET 86 of the content addressable memory cell 80 and a power supply (FIG. 12). This case can also shorten the period that a through current flows and reduce power that is wastefully dissipated by a through current.

Note that in the circuits shown in FIGS. 11 and 12 the amplitude is large because the voltage $V_{MATCH}$ changes between $V_{DD}$ and 0, but if a voltage drop element is provided in the position $P_1$ of FIG. 11 or the position $P_2$ of FIG. 12, the amplitude of the voltage $V_{MATCH}$ on the side of the content addressable memory cell 28 of the match-line with this voltage drop element as a boundary can be smaller, so power dissipation will be reduced. Further, the voltage drop element is preferable because the change speed of the voltage $V_{MATCHI}$ becomes faster by the internal resistance of the voltage drop element than that of the voltage $V_{MATCH}$.

Fourth Embodiment

Figure 13:
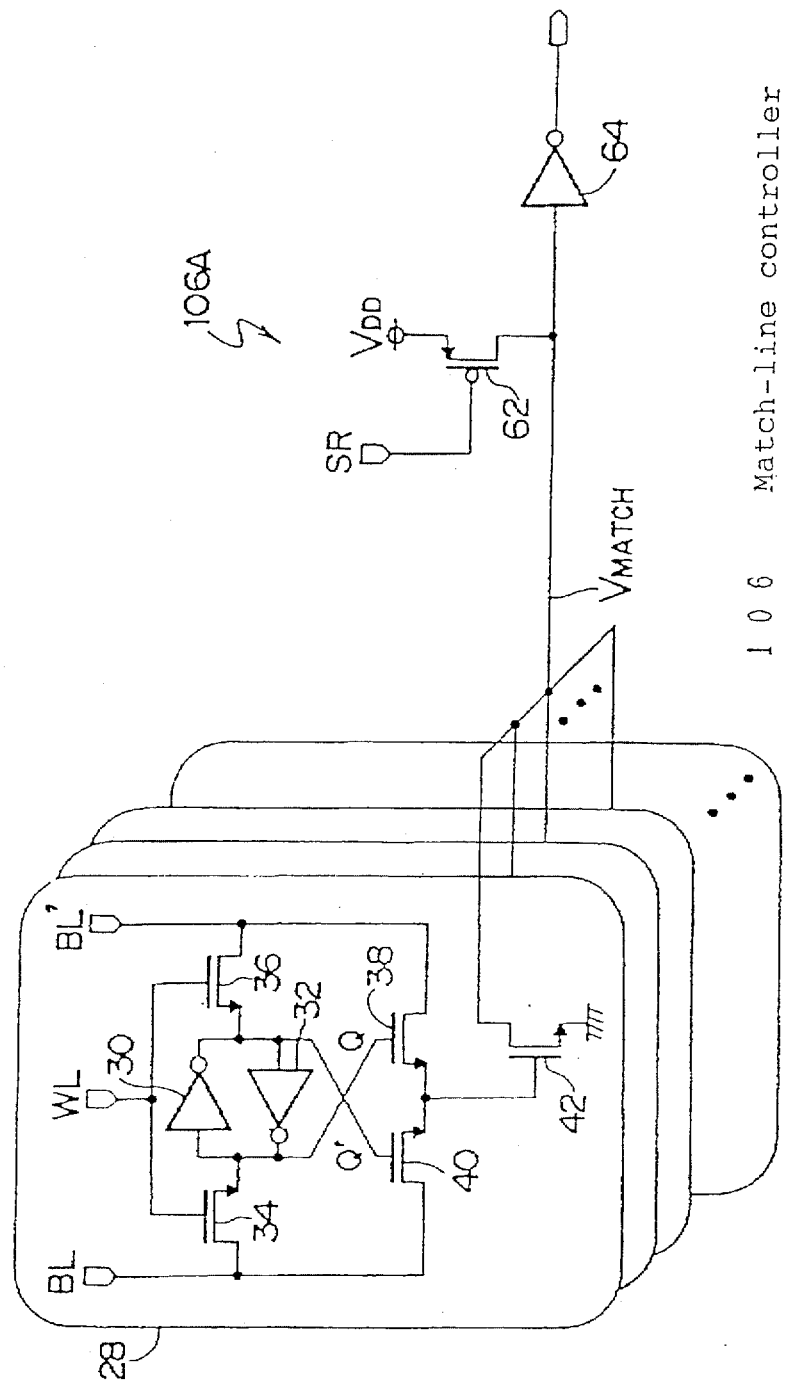
FIG. 13 is a circuit diagram showing a match-line controller according to a fourth embodiment.

The fourth embodiment of the present invention will hereinafter be described. Note that the same reference numerals will be applied to the same parts as the first to third embodiments and a description of the same parts will not be given. As shown in FIG. 13, in a match-line controller 106A of the fourth embodiment corresponding to the match-line controller 58 shown in FIG. 3, the N-MOSFET 60 and the P-MOSFET 66 are omitted and a timing control signal SR is input only to the gate of a P-MOSFET 62.

In the match-line controller 106A according to the fourth embodiment, the voltage $V_{MATCH}$ on the match-line changes to a level corresponding to a comparison result in the content addressable memory cell string, when the timing control signal SR goes to a low level and the P-MOSFET 62 is switched on. That is, when the comparison result in the content addressable memory cell string is "match" and the N-MOSFET 42 is off, the voltage $V_{MATCH}$ will increase up to a power supply voltage $V_{DD}$ if the P-MOSFET 62 is switched on. Also, when the comparison result in the content addressable memory cell string is "mismatch" and the N-MOSFETs 42 of some of the content addressable memory cells 28 are on, the voltage $V_{MATCH}$ is reduced to the ground level and a through current is to flow by way of the P-MOSFET 62.

Figure 14:
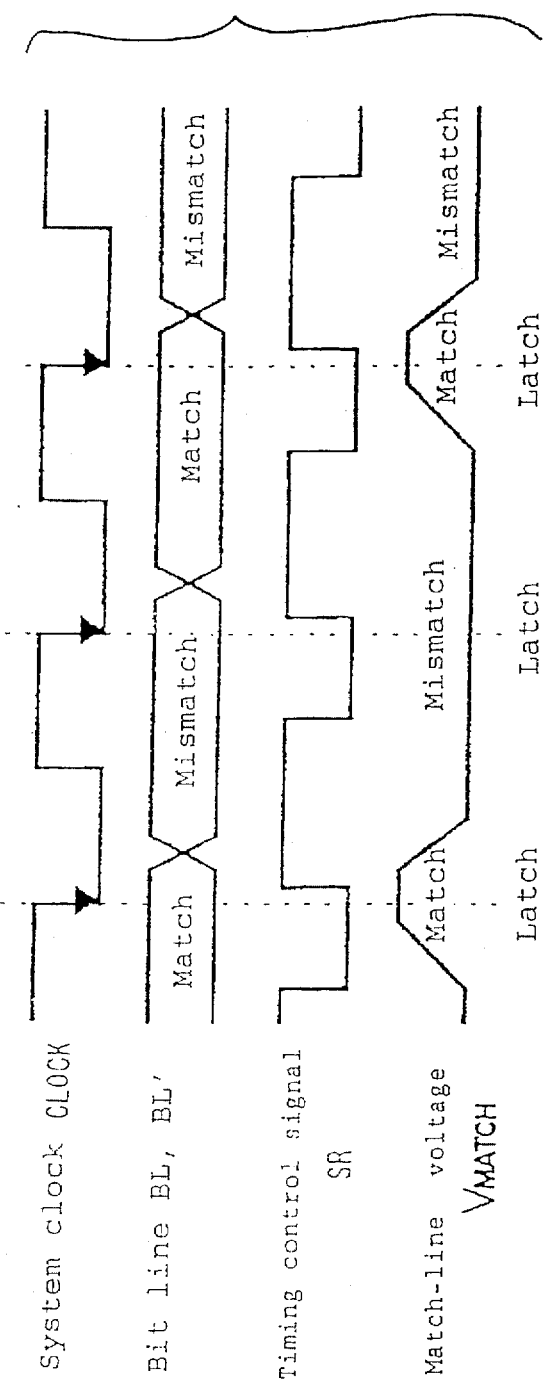
FIG. 14 is a timing diagram showing the timing control signal, change in a match-line voltage $V_{MATCHI}$, and signal latch timing in the circuit of FIG. 13.

Therefore, the fourth embodiment uses the above-described inverted signal of the timing control signal SR (FIG. 9) of the third embodiment to make shorter the low level period that the P-MOSFET 62 is on (FIG. 14). As a result, the period that a through current flows becomes short, and the power that is wastefully dissipated by a through current is reduced.

Note that when a previous comparison result is "mismatch," it takes a little time for the voltage $V_{MATCH}$ to be pulled up and become stable, because the $V_{MATCH}$ is reduced to the ground level when the N-MOSFET 62 is switched on. For this reason, a signal output from the match-line controller 106A is latched by the address output circuit 68 at the time a predetermined time has elapsed after the low level of the timing control signal SR, as shown in FIG. 14. FIG. 14 shows an example of latching by the address output circuit 68 in synchronization with the fall of the pulse of the system clock CLOCK.

Figure 15:
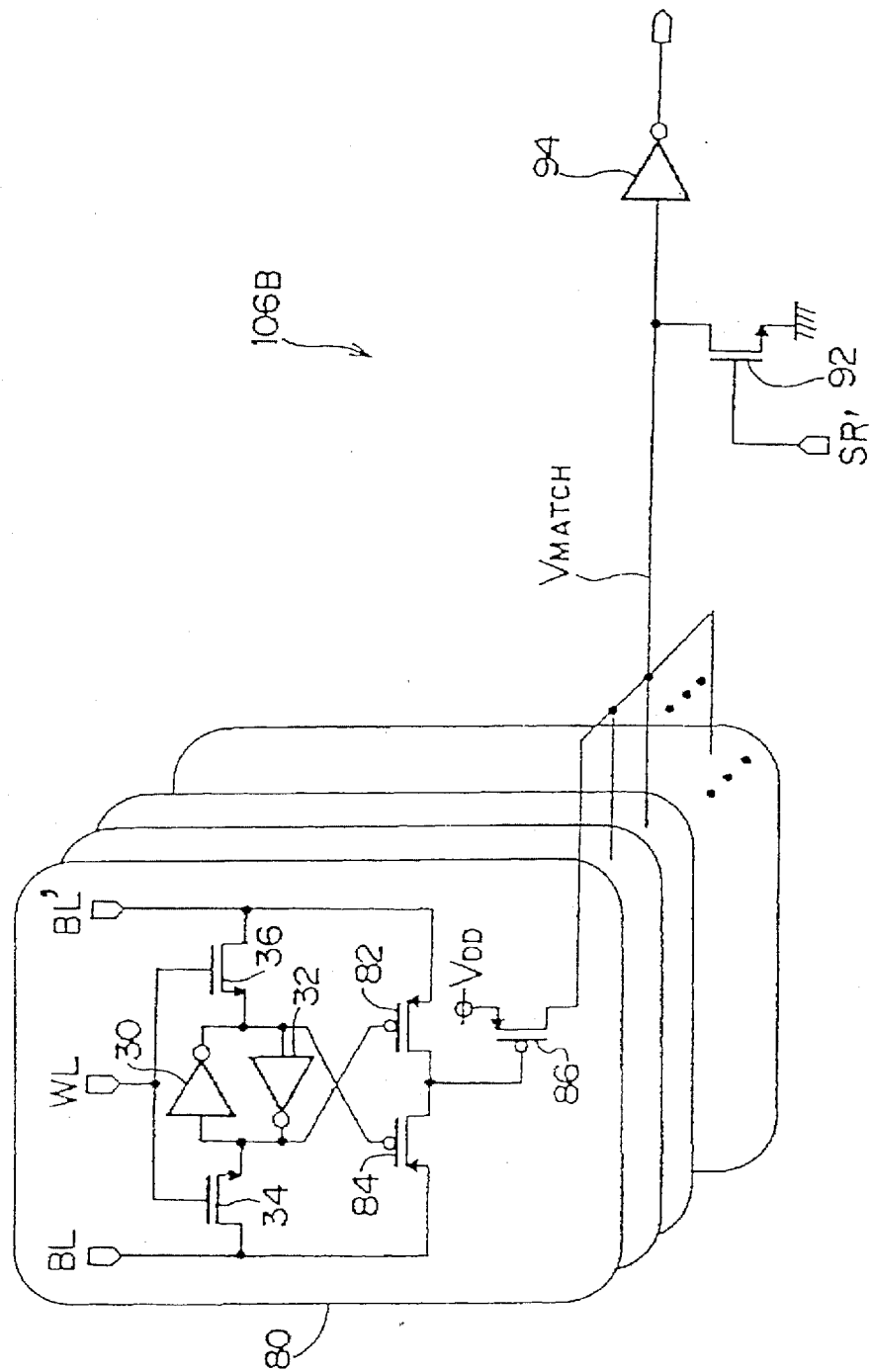
FIG. 15 is a circuit diagram showing another example of the match-line controller that is connected to the content addressable memory cell of reverse polarity.

Note that in the match-line controller 88 connected to the reverse-polarity content addressable memory cell 80 of FIG. 5, a match-line controller 106B (FIG. 15) may be constituted such that, as in the above case, the P-MOSFET 90 and the N-MOSFET 96 are omitted and a timing control signal SR' is input only to the gate of an N-MOSFET 92. As the timing control signal SR', there can be used a signal which is an inverse of the timing control signal SR shown in FIG. 14. This constitution can also shorten the period that a through current flows and reduce power that is wastefully dissipated by a through current.

Figure 16:
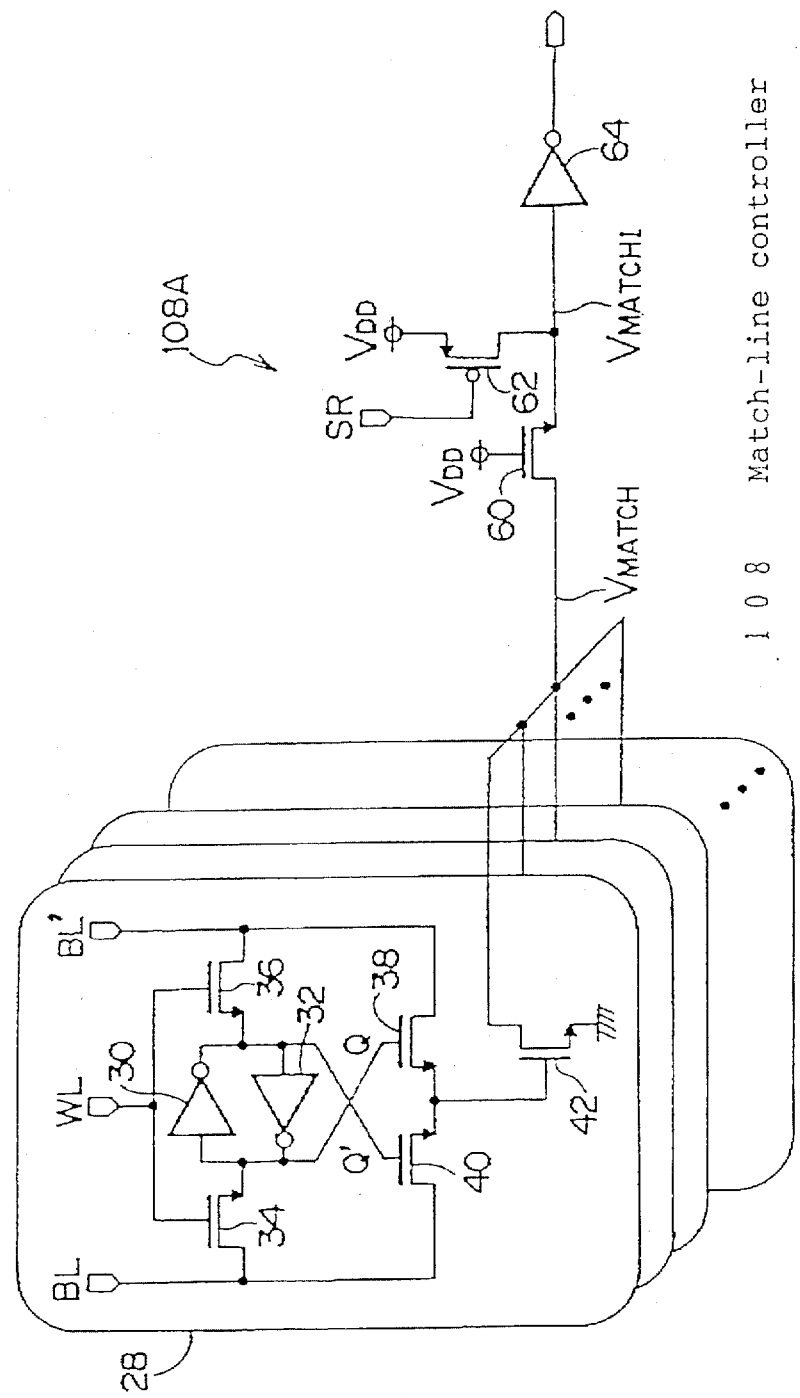
FIG. 16 is a circuit diagram showing an N-MOSFET provided as a resistance element in the circuit of FIG. 13.
Figure 17:
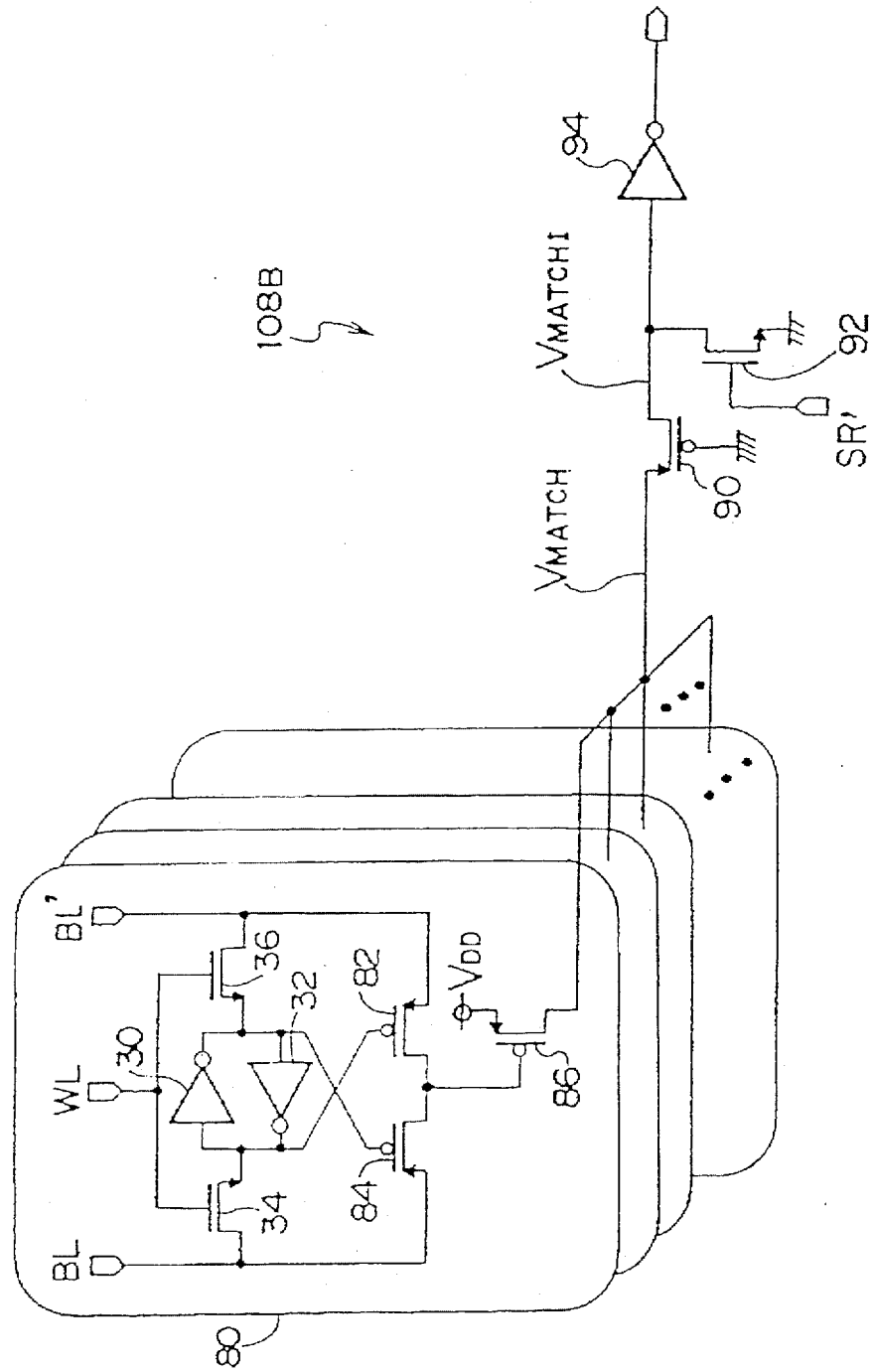
FIG. 17 is a circuit diagram showing a P-MOSFET provided as a resistance element in the circuit of FIG. 13.

Note that in the circuits shown in FIGS. 13 and 14 the amplitude is large because the voltage $V_{MATCH}$ changes between $V_{DD}$ and 0, but it is preferable that in the circuit shown in FIG. 13 a voltage drop element be provided between the drain of the P-MOSFET 62 and the drain of the N-MOSFET 42 of the content addressable memory 28 and in the circuit shown in FIG. 14 a voltage drop element be provided between the drain of the N-MOSFET 92 and the drain of the P-MOSFET 86 of the content addressable memory 28. As an example, a match-line controller 108A provided at the above-described position of the circuit of FIG. 13 with a normally-on N-MOSFET 60 as a resistance element is shown in FIG. 16, and a match-line controller 108B provided at the above-described position of the circuit of FIG. 14 with a normally-on P-MOSFET 90 as a resistance element is shown in FIG. 17. From the foregoing description, the amplitude of $V_{MATCH}$ becomes smaller, so power dissipation is reduced and the change speed of the voltage $V_{MATCHI}$ becomes faster than that of the voltage $V_{MATCH}$.

Description of Result of Experiment

A description will next be made as to the result of an experiment in which the change in the voltage on the match-line and change in the current flowing through the match-line in the search operation were simulated with the conventional circuit (FIG. 24) and the match-line controller 58 shown in FIG. 3.

Figure 19:
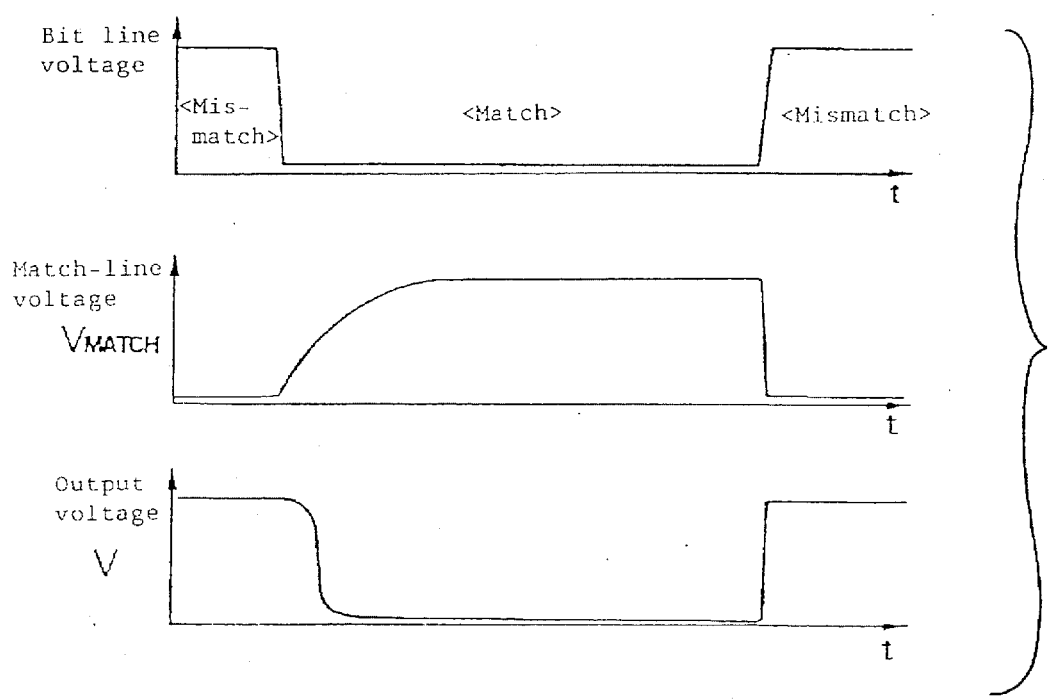
FIG. 19 is a diagram showing a result of the simulation of the match-line voltage $V_{MATCH}$ and the voltage level V of the output signal under the best conditions in a conventional method.
Figure 20:
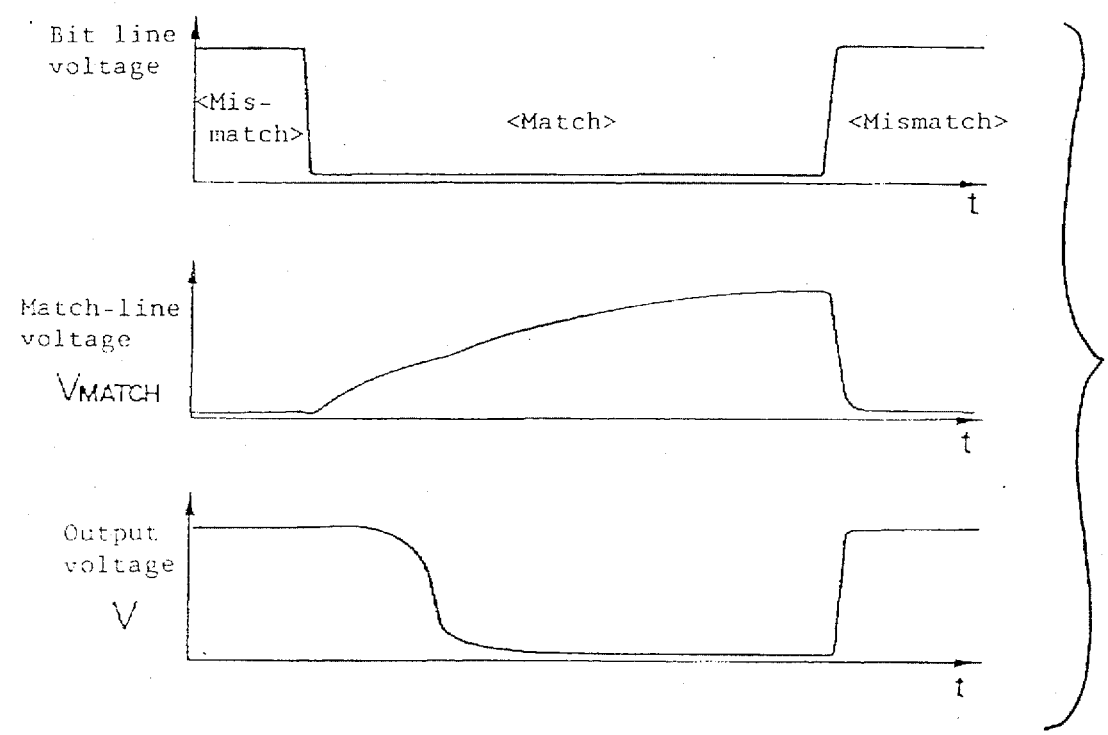
FIG. 20 is a diagram showing a result of the simulation of the match-line voltage $V_{MATCH}$ and the voltage level V of the output signal under the worst conditions in the conventional method.

As to the conventional circuit, FIG. 19 shows how the voltage $V_{MATCH}$ on the match-line with respect to a change in a bit line voltage and the voltage level V on a signal to be output from the NOT circuit 202 are changed under the best conditions that a power supply voltage is 3.6 V, a surrounding temperature is 0° C., and process parameters (representative of a fluctuation in each of transistors constituting a circuit) are optimum, and FIG. 20 shows how the voltage $V_{MATCH}$ on the match-line with respect to a change in a bit line voltage and the voltage level V on a signal to be output from the NOT circuit 202 are changed under the worst conditions that a power supply voltage is 3.0 V, a surrounding temperature is 100° C., and process parameters (representative of a fluctuation in each of transistors constituting a circuit) are worst. Note that it is assumed that in FIGS. 19 and 20, with respect to search data input through the bit line pair, the comparison result changes to mismatch, to match, and to mismatch in this order.

As will clearly be seen from FIG. 19, in the conventional method the change speed of the match-line voltage $V_{MATCH}$ as the comparison result changed from "match" to "mismatch" is relatively fast, but the change speed of the match-line voltage $V_{MATCH}$ as the comparison result changed from "mismatch" to "match" is slow even in the best conditions. This is because the internal resistance of the P-MOSFET 204 has been increased to some degree to suppress a through current that flows when the comparison result is "mismatch" to some degree. This phenomenon becomes more conspicuous in the worst conditions shown in FIG. 20, and the match-line voltage $V_{MATCH}$ gradually increases at a small gradient. Therefore, the time at which the level of the output signal of the NOT circuit 202 is inverted has been delayed considerably. This means that in the conventional circuit the cycle of the comparison operation cannot be too much shortened in view of process margin and changes in surrounding environments and therefore the search operation cannot be performed at high speeds.

Figure 21:
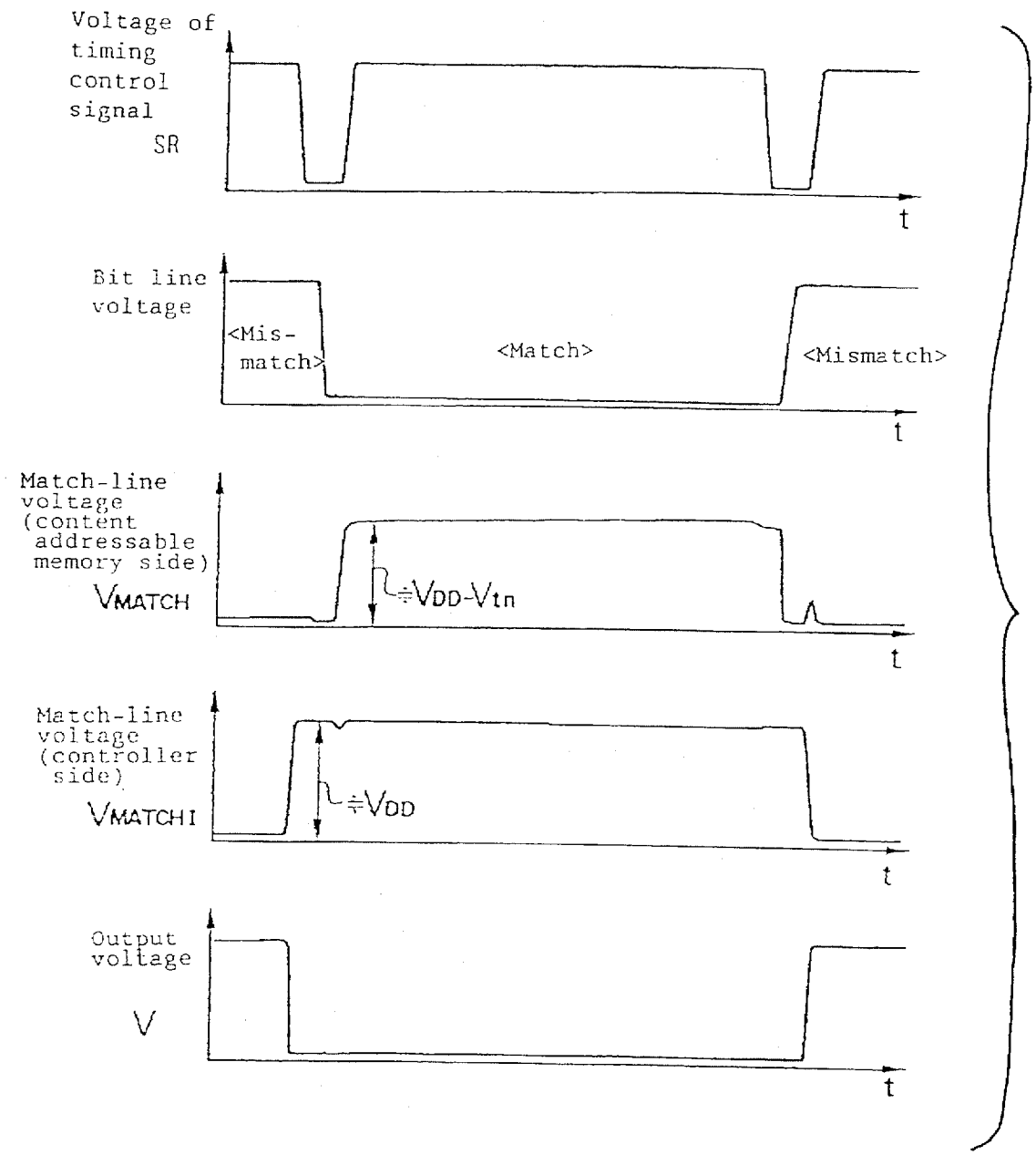
FIG. 21 is a diagram showing a result of the simulation of the match-line voltages $V_{MATCH}$, $V_{MATCHI}$ and the voltage level V of the output signal under the best conditions in the circuit of FIG. 3.
Figure 22:
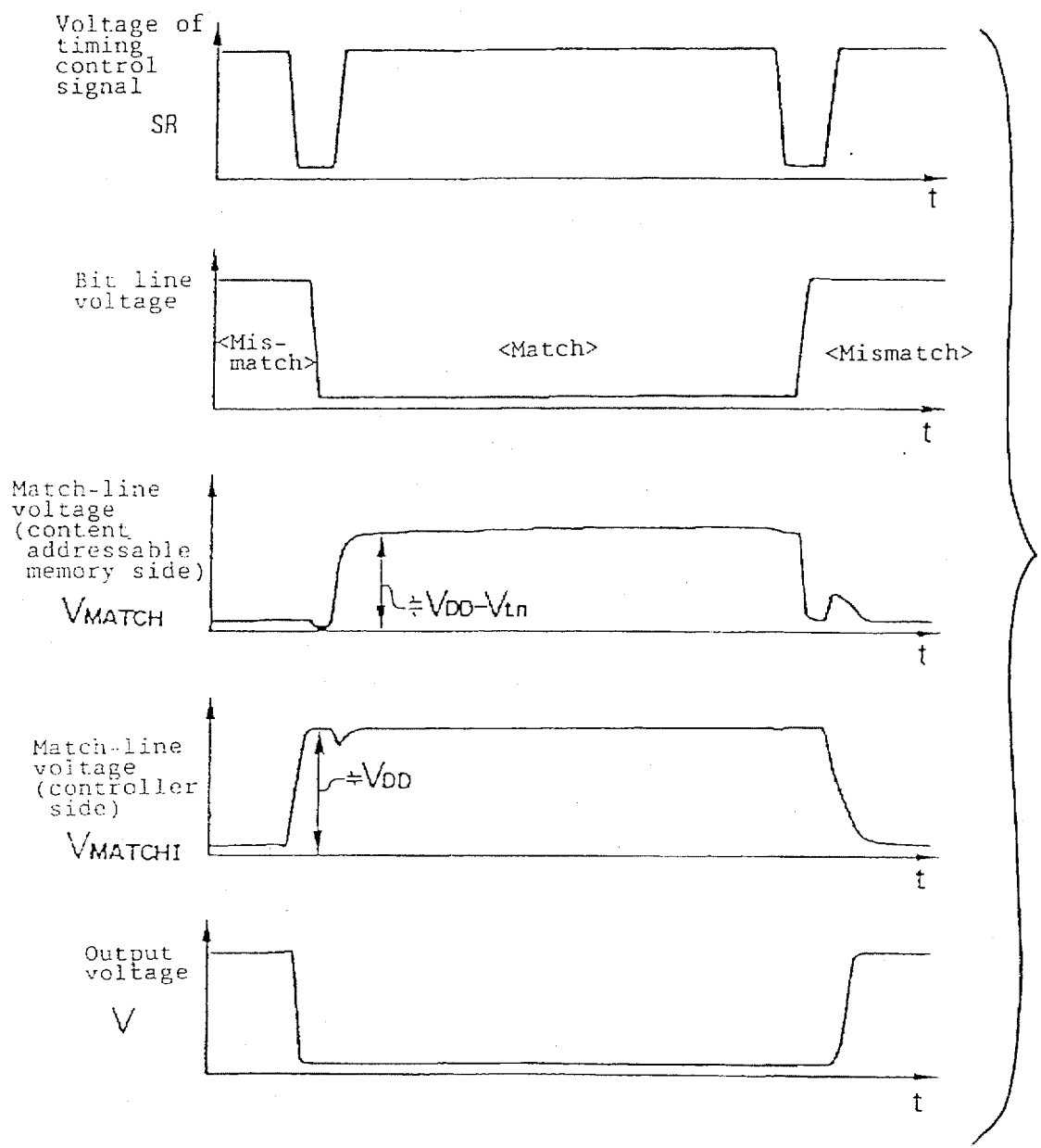
FIG. 22 is a diagram showing a result of the simulation of the match-line voltages $V_{MATCH}$, $V_{MATCHI}$ and the voltage level V of the output signal under the worst conditions in the circuit of FIG. 3.

By contrast, the results of experiments in which the circuit of the present invention shown in FIG. 3 was simulated under the same conditions are shown in FIGS. 21 and 22. As shown in FIG. 21, in the circuit according to the present invention, concurrently when the timing control signal SR goes to a low level, the match-line voltage $V_{MATCHI}$ on the controller side rapidly rises and reaches the power supply voltage $V_{DD}$, and accordingly the signal output from the NOT circuit 64 is inverted in an instant. This is almost the same even in the worst conditions shown in FIG. 22. Note that at that time, the level on a signal to be output from the NOT circuit 64 has no relation with the comparison result, but since the change in the voltage $V_{MATCHI}$ is fast, it is possible to make shorter the period the timing control signal SR is low in order to early reflect the comparison result on the level of a signal output from the NOT circuit 64. Consequently, the search operation can be performed at very high speeds, as compared with the conventional method.

If the timing control signal SR returns back to a high level and the N-MOSFET 60 is switched on, the electric charge stored in N-MOSFET 60 will be distributed to the portion of the match-line on the side of the content addressable memory cell 28 and the match-line voltage $V_{MATCHI}$ on the controller side will be dropped once, but it will be obvious that the level is corrected by a half-latch comprising the NOT circuit 64 and the P-MOSFET 66 and has been restored to its original level. Also, even if the N-MOSFET 60 were switched on, the match-line voltage $V_{MATCH}$ on the content addressable memory side has not been increased to more than $V_{DD}-V_{tn}$ (wherein $V_{tn}$ is the voltage drop by the N-MOSFET 60) and the amplitude of the change in the match-line voltage $V_{MATCH}$ has been small, so it can be understood that power dissipation is reduced.

Figure 23A:
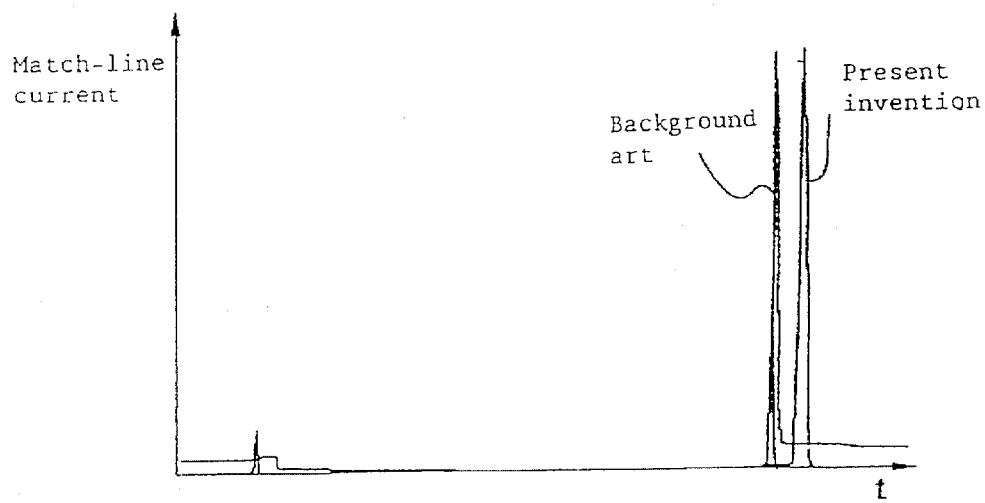
FIG. 23(A) is a diagram showing a result of the simulation of the current that flows through the match-line under the best conditions in the conventional method and the circuit of FIG. 3.
Figure 23B:
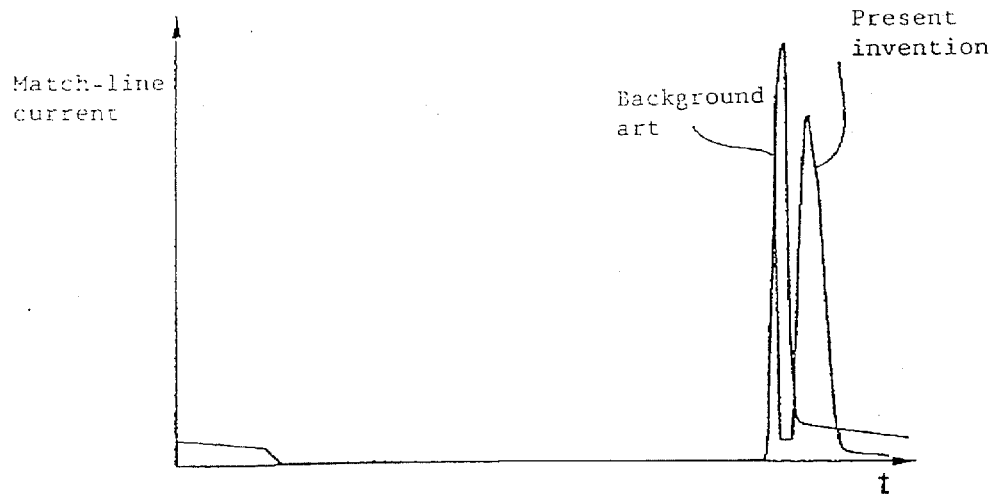
FIG. 23(B) is a diagram showing a result of the simulation of the current that flows through the match-line under the worst conditions in the conventional method and the circuit of FIG. 3.

Also, FIG. 23(A) shows how current flows under the above-described same best conditions, and FIG. 23(B) shows how current flows under the above-described same worst conditions. As clearly shown in FIG. 23, the circuit of the conventional method and the circuit according to the present invention are the same for the magnitude of a discharge current that flows when the comparison result is "mismatch." However, in the circuit according to the present invention, current other than the discharge current in the "mismatch" does not flow, but in the conventional circuit the through current flows constantly after discharge. According to the simulation performed by the inventor of this application, the magnitude of this through current is about 300 μA per match-line, but since a large number of match-lines are provided in the content addressable memory cell array, in the entire content addressable memory cell array the through current becomes an enormous current. Since in the present invention this through current can be prevented, it is obvious that power dissipation is greatly reduced.

While in the above-described embodiments the MOSFET has been used as various kinds of switching means, the present invention is not limited to this but it is applicable to switching elements such as a bipolar transistor and a FET.

Advantages of the invention

In the present invention, the first switching means is provided on the match-line between the opposite side of the switching element to the ground terminal and a power supply, and the first switching means is switched on during the period that the content addressable memory is switching on or off the switching element according to the result of comparison, or during a partial period within a preparatory period before the comparison. The present invention, therefore, has the advantage that the period that the through current is flowing can be made shorter, and the power that is dissipated by the through current can be reduced.

Also, in the present invention, pull-up means is provided on the opposite side of the switching element to the ground terminal for pulling up the match-line, and the second switching means is provided on the match-line between the pull-up means and the ground terminal. The second switching means is switched on during a partial period within the period that the content addressable memory is switching on or off the switching element according to the result of comparison. The present invention, therefore, has the advantage that the period that the through current is flowing can be made shorter, and the power that is dissipated by the through current can be reduced.

Also, if in the above, the pull-up means is constituted by first switching means provided on the match-line between the opposite side of the switching element to the ground terminal and a power supply, and first control means for switching on the first switching means during a predetermined period before the second switching means is switched on, there will be obtained the advantage that the through current can completely be suppressed and, further, power dissipation can be reduced.

Also, if a resistance element is provided on the match-line between the pull-up means and the switching element of the content addressable memory, there will be obtained the advantage that the change in the voltage on the pull-up means side can be made fast with the resistance element as a boundary.

Also, if, in the above, by the third control means the first switching means is switched on and also the first switching means is switched off and the second switching means is switched on within the period that the content addressable memory is switching on or off the switching element according to the result of comparison, after the second switching means has been switched off, and there is provided level correction means for correcting a reduction in an voltage on the match-line as the switching second means is switched on with the switching element switched off, there will be obtained the advantage that the through current can completely be suppressed, power dissipation can be reduced, and the voltage level of the output signal as the second switching means is switched on with the switching element of the content addressable memory switched off can be made constant.

Also, if the second switching means comprises a MOSFET and is provided on the match-line between the pull-up means and the switching element, there is obtained the advantage that only the amplitude of a change in the voltage on the portion between the resistance element and the ground terminal can be made smaller without making smaller the amplitude of a change in a voltage as a result of search, and the power dissipation by the switching element of the content addressable memory can be reduced.

I claim:

1. A content-addressable-memory control circuit to be connected to a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element, including one of pull-up and pull-down means comprising:

first switching means provided on said match-line between the opposite side of said switching element to said ground terminal and a power supply; and first control means for switching on said first switching means during a time period, the time period being the period that said content addressable memory is switching on or off said switching element according to said result of comparison.

2. A content-addressable-memory control circuit as recited in claim 1, said time period being during a partial period within a preparatory period before the comparison.

3. The content-addressable-memory control circuit as set forth in claim 1, wherein a resistance element is further provided on said match-line between said pull-up means and said switching element of said content addressable memory.

4. A content-addressable-memory control circuit to be connected to a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element, comprising:

one of pull-up and pull-down means provided on the opposite side of said switching element to said ground terminal for respectively pulling up or pulling down said match-line;

second switching means provided on said match-line between said one of pull-up and pull-down means and said ground terminal; and second control means for switching on said second switching means during a partial period within the period that said content addressable memory is switching on or off said switching element according to said result of comparison.

5. The content-addressable-memory control circuit as set forth in claim 4, wherein said one of pull-up and pull-down means comprises second switching means provided on said match-line between the opposite side of said switching element to said ground terminal and a power supply, and second control means for switching on said second switching means during a predetermined period before said first switching means is switched on.

6. The content-addressable-memory control circuit as set forth in claim 5, wherein a resistance element is further provided on said match-line between said one of pull-up and pull-down means and said switching element of said content addressable memory.

7. The content-addressable-memory control circuit as set forth in claim 5, wherein said first switching means comprises a metal-oxide-semiconductor field-effect transistor (MOSFET) and is provided on said match-line between said one of pull-up and pull-down means and said switching element.

8. The content-addressable-memory control circuit as set forth in any one of claim 4, wherein a resistance element is further provided on said match-line between said one of pull-up and pull-down means and said switching element of said content addressable memory.

9. The content-addressable-memory control circuit as set forth in claim 4, wherein said first switching means comprises a metal-oxide-semiconductor field-effect transistor (MOSFET) and is provided on said match-line between said one of pull-up and pull-down means and said switching element.

10. A content-addressable-memory control circuit to be connected to a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element, comprising:

pull-up means provided with first switching means provided on said match-line between the opposite side of said switching element to said ground terminal and a power supply;

second switching means provided on said match-line between said pull-up means and said switching element;

first control means for switching on said first switching means and for switching said first switching means off and said second switching means on within the period that said content addressable memory is switching on or off said switching element according to said result of comparison, after said second switching means has been switched off; and level correction means for correcting a reduction in a voltage of said match-line as said second switching means is switched on with said switching element switched off.

11. The content-addressable-memory control circuit as set forth in claim 6, wherein said second switching means comprises a MOSFET.

12. A content-addressable-memory control circuit to be connected to a content addressable memory which comprises a memory element, a data input terminal, and a switching element provided between a match-line and a power supply and which, if comparison data is input through said data input terminal, will switch on or off said switching element according to a result of comparison between said comparison data and data stored in said memory element, comprising:

pull-down means provided with first switching means provided on said match-line between the opposite side of said switching element to said power supply and a ground terminal;

second switching means provided between said pull-down means and said switching element;

first control means for switching on said first switching means and for switching said first switching means off and said second switching means on within the period that said content addressable memory is switching on or off said switching element according to said result of comparison, after said second switching means has been switched off; and level correction means for correcting a rise in an voltage of said match-line as said second switching means is switched on with said switching element switched off.

13. A content addressable memory device including:

a content addressable memory which comprises a memory element, a data input terminal, and a switching element provided between a match-line and a ground terminal and which, if comparison data is input through said data input terminal, will switch on or off said switching element according to a result of comparison between said comparison data and data stored in said memory element; and pull-up means comprising first switching means provided on said match-line between the opposite side of said switching element to said ground terminal and a power supply, and first control means for switching on said first switching means during a time period, the time period being the period that said content addressable memory is switching on or off said switching element according to said result of comparison.

14. A content-addressable-memory control circuit as recited in claim 13, said time period being during a partial period within a preparatory period before the comparison.

* * * * *